United States Patent
Ishii et al.

(10) Patent No.: US 11,701,750 B2
(45) Date of Patent: Jul. 18, 2023

(54) TOP RING FOR HOLDING A SUBSTRATE AND SUBSTRATE PROCESSING APPARATUS

(71) Applicant: EBARA CORPORATION, Tokyo (JP)

(72) Inventors: Yu Ishii, Tokyo (JP); Hirotaka Satori, Tokyo (JP); Makoto Kashiwagi, Tokyo (JP); Manato Furusawa, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 0 days.

(21) Appl. No.: 17/099,571

(22) Filed: Nov. 16, 2020

(65) Prior Publication Data

US 2021/0170543 A1    Jun. 10, 2021

(51) Int. Cl.
*B24B 37/32* (2012.01)
*H01L 21/683* (2006.01)

(52) U.S. Cl.
CPC .......... *B24B 37/32* (2013.01); *H01L 21/6838* (2013.01)

(58) Field of Classification Search
CPC ................. B24B 37/27–34; B24B 37/04–042
USPC .................... 451/41, 285–288, 388, 397–398
See application file for complete search history.

(56) References Cited

U.S. PATENT DOCUMENTS

| | | | | |
|---|---|---|---|---|
| 5,398,459 A | * | 3/1995 | Okumura | B24B 37/30 451/286 |
| 5,476,414 A | * | 12/1995 | Hirose | H01L 21/02024 451/388 |
| 5,733,182 A | | 3/1998 | Muramatsu et al. | |
| 6,030,488 A | * | 2/2000 | Izumi | B24B 37/30 451/388 |
| 6,033,292 A | | 3/2000 | Inaba | |
| 6,116,992 A | * | 9/2000 | Prince | B24B 37/30 451/286 |
| 6,196,905 B1 | * | 3/2001 | Inaba | B24B 49/16 451/287 |
| 6,276,998 B1 | * | 8/2001 | Sommer | B24B 41/04 451/286 |
| 6,435,949 B1 | * | 8/2002 | Katsuoka | B24B 37/30 451/288 |

(Continued)

FOREIGN PATENT DOCUMENTS

| | | |
|---|---|---|
| EP | 0835723 A1 | 4/1998 |
| JP | H07-124862 A | 5/1995 |

(Continued)

OTHER PUBLICATIONS

European Patent Application No. 20208443.0; Extended Search Report; dated Sep. 2, 2021; 8 pages.

*Primary Examiner* — Joseph J Hail
*Assistant Examiner* — Jonathan R Zaworski
(74) *Attorney, Agent, or Firm* — BakerHostetler

(57) ABSTRACT

Provided is a top ring that ensures uniformly pressing a substrate against a polishing pad. A top ring 302 for holding a substrate WF includes a base member 301 coupled to a top ring shaft 18, an elastic film 320 that is mounted to the base member 301 and forms a pressurization chamber 322 for pressurizing the substrate WF between the base member 301 and the elastic film 320, a substrate suction member 330 that includes a porous member 334 including a substrate suction surface 334a for suctioning the substrate WF and a pressure reducing portion 334b communicating with a pressure reducing unit 31. The substrate suction member 330 is held to the elastic film 320.

18 Claims, 21 Drawing Sheets

(56) References Cited

U.S. PATENT DOCUMENTS

| | | | |
|---|---|---|---|
| 6,645,050 B1 * | 11/2003 | Butterfield | B24B 37/32 451/388 |
| 6,755,723 B1 * | 6/2004 | Pham | B24B 37/30 451/287 |
| 6,848,980 B2 * | 2/2005 | Chen | B24B 37/30 451/41 |
| 6,852,019 B2 * | 2/2005 | Togawa | B24B 41/061 451/388 |
| RE38,878 E * | 11/2005 | Hirose | B24B 37/30 451/41 |
| 7,101,273 B2 * | 9/2006 | Tseng | B24B 37/30 451/288 |
| 7,357,699 B2 * | 4/2008 | Togawa | B24B 37/30 451/388 |
| 7,497,767 B2 * | 3/2009 | Chen | B24B 37/30 451/288 |
| 8,591,286 B2 * | 11/2013 | Chen | B24B 37/015 451/286 |
| 2002/0119735 A1 | 8/2002 | Nakamura et al. | |
| 2021/0277272 A1 * | 9/2021 | Yasuda | C08L 83/04 |

FOREIGN PATENT DOCUMENTS

| | | |
|---|---|---|
| JP | H07-241764 A | 9/1995 |
| JP | H08-229809 A | 9/1996 |
| JP | H11-042550 A | 2/1999 |
| JP | 2002-261056 A | 9/2002 |
| JP | 3668529 B2 | 7/2005 |
| JP | 2008-296334 A | 12/2008 |
| JP | 2011-159655 A | 8/2011 |

* cited by examiner

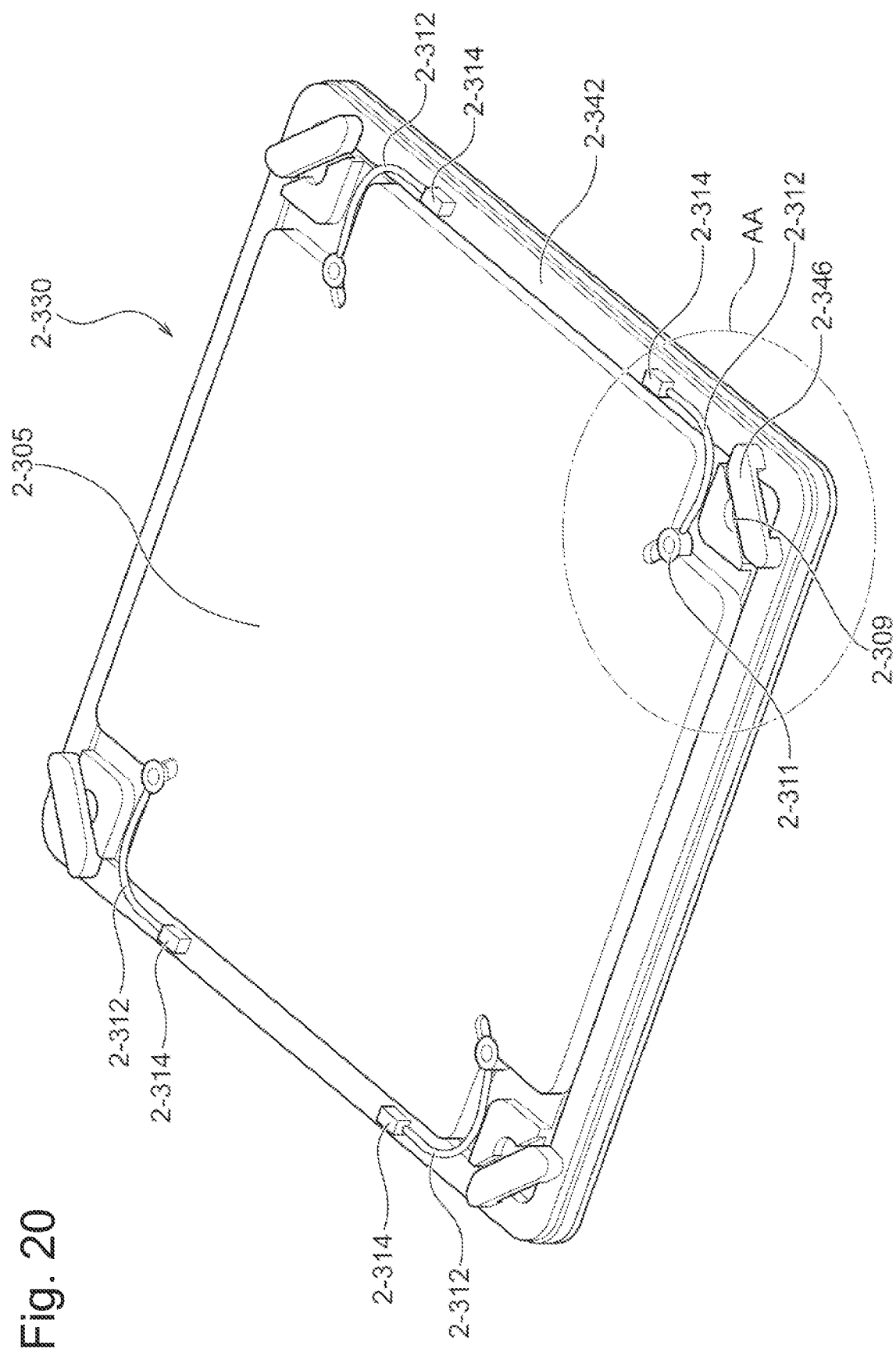

TOP RING FOR HOLDING A SUBSTRATE AND SUBSTRATE PROCESSING APPARATUS

TECHNICAL FIELD

This application relates to a top ring for holding a substrate and a substrate processing apparatus. This application claims priority from Japanese Patent Application No. 2019-208865 filed on Nov. 19, 2019 and Japanese Patent Application No. 2020-167306 filed on Oct. 1, 2020. The entire disclosures including the descriptions, the claims, the drawings, and the abstracts in Japanese Patent Application No. 2019-208865 and Japanese Patent Application No. 2020-167306 are herein incorporated by reference.

BACKGROUND ART

Fabricating semiconductor devices employs a chemical mechanical polishing (CMP) device to planarize surfaces of substrates. The substrates used in the fabrication of the semiconductor devices are in a circular-plate shape in many cases. Additionally, not only for the semiconductor devices, but also when surfaces of quadrangular substrates, such as copper clad laminate substrates (CCL substrates), printed circuit board (PCB) substrates, photomask substrates, and display panels, are planarized, there is an increasing demand for flatness. Further, there is an increasing demand for planarizing surfaces of package substrates on which electronic devices such as PCB substrates are arranged.

A substrate processing apparatus, such as a chemical mechanical polishing device, contains atop ring for holding a substrate. For example, as described in PTL 1, the top ring includes a rotation shaft, a flange portion coupled to the rotation shaft, a porous suction plate fitted to the flange portion, and a shielding plate attached on an upper surface of the suction plate. This top ring is configured to suction the substrate via micropores of the suction plate by vacuum suction and press the substrate against a polishing pad by applying pressure to the shielding plate.

Additionally, a substrate processing apparatus, such as a chemical mechanical polishing device, contains a top ring for holding a substrate. For example, as described in PTL 1, the top ring includes a rotation shaft, a flange coupled to the rotation shaft, a porous suction plate fitted to an opening formed on a lower surface of the flange, and a shielding plate attached on an upper surface of the suction plate. This top ring is configured to suction the substrate via micropores of the suction plate by vacuum suction and press the substrate against a polishing pad by applying pressure to the shielding plate.

CITATION LIST

Patent Literature

PTL 1: Japanese Patent No. 3668529

SUMMARY OF INVENTION

Technical Problem

The technique described in PTL 1 has a room for improvement in ensuring a compact top ring that ensures uniformly pressing a substrate against a polishing pad.

That is, in a substrate processing apparatus, a surface plate on which the top ring or the polishing pad is attached may be tilted due to manufacturing tolerance of respective components. On the other hand, in the top ring described in PTL 1, a suction plate is fitted in the opening of a flange. Therefore, when the top ring or the surface plate is tilted, the surface of the substrate to be polished held to the top ring and the polishing surface of the polishing pad do not come into contact in parallel, and as a result, there is a possibility that the substrate cannot be uniformly pressed against the polishing pad.

In this respect, it is conceivable not to fit the suction plate to the opening of the flange, but to connect a frame-shaped member of the flange forming the opening to the suction plate via an elastic film. With this configuration, even if the top ring or the surface plate is tilted, it is considered that the suction plate can be aligned with the polishing surface of the polishing pad by the elasticity of the elastic film, and the substrate can be uniformly pressed against the polishing pad.

However, when an attempt is made to route a vacuum passage for vacuum suction from the suction plate through the frame-shaped member of the top ring, the plane size of the top ring becomes large due to space limitation of the frame-shaped member, thus hindering downsizing of the top ring.

Therefore, one object of this application is to provide the top ring and the substrate processing apparatus that can uniformly press the substrate against the polishing pad.

Solution to Problem

According to one embodiment, a top ring for holding a substrate is disclosed, the top ring includes a base member, an elastic film, and a substrate suction member. The base member is coupled to a rotary shaft. The elastic film is mounted to the base member and forms a pressurization chamber for pressurizing the substrate between the base member and the elastic film. The substrate suction member includes a porous member having a substrate suction surface for suctioning the substrate and a pressure reducing portion communicating with a pressure reducing unit. The substrate suction member is held to the elastic film.

According to one embodiment, a top ring for holding a substrate is disclosed, the top ring includes a base member, a substrate suction member, and an elastic member. The base member is coupled to a rotary shaft. The substrate suction member includes a porous member that includes a substrate suction surface for suctioning the substrate and a pressure reducing portion communicating with a pressure reducing unit. The shielding member is configured to shield a surface of the porous member on an opposite side of the substrate suction surface and a side surface. The framing member is disposed on the shielding member so as to surround at least a part of a periphery of the base member. The elastic member connects the at least a part of the base member surrounded by the framing member to the framing member.

BRIEF DESCRIPTION OF DRAWINGS

FIG. 20 is a perspective view schematically illustrating a substrate suction member according to the one embodiment.

DESCRIPTION OF EMBODIMENTS

Figure 1:
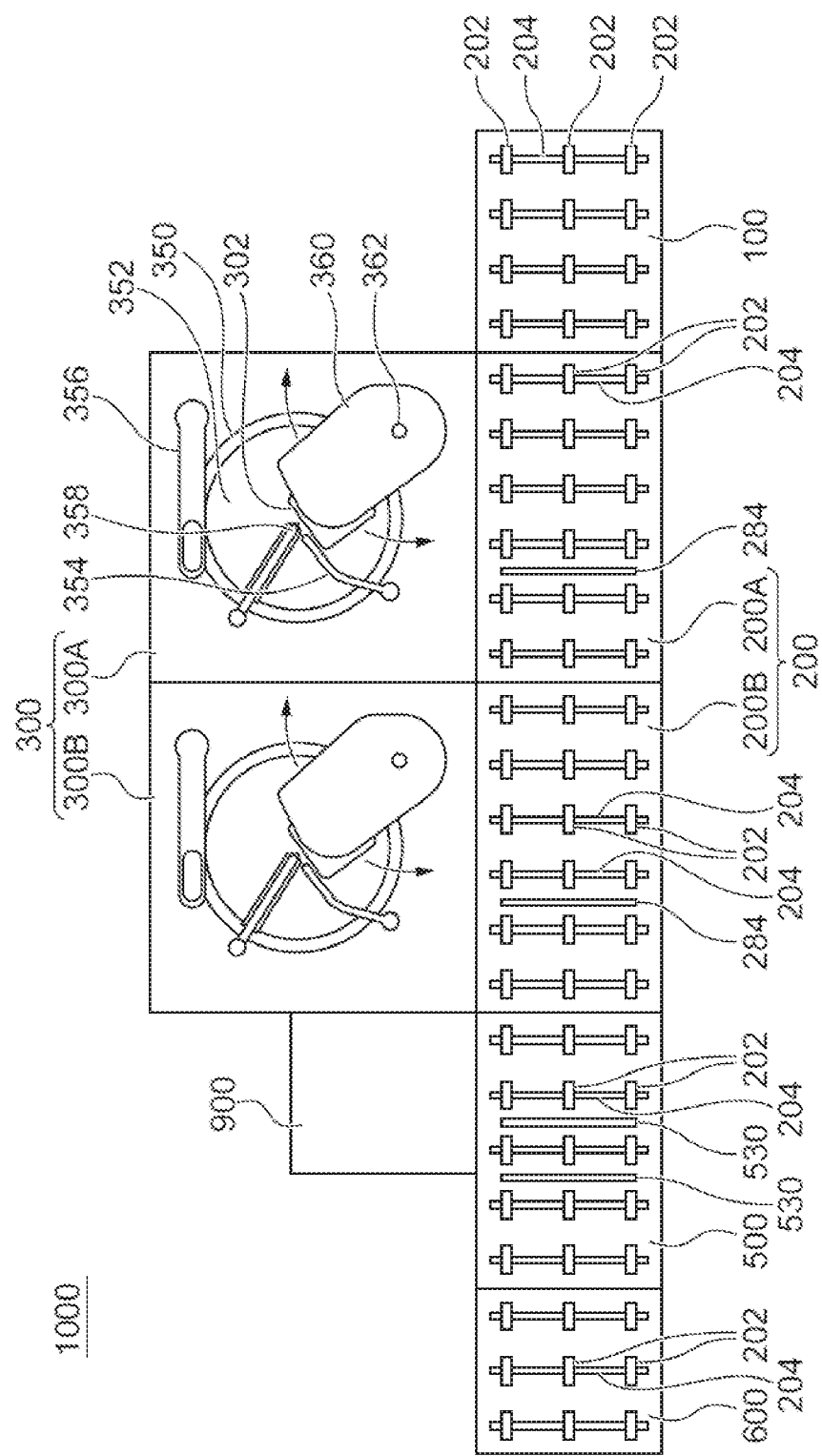
FIG. 1 is a plan view illustrating an overall configuration of a substrate processing apparatus according to one embodiment.

The following describes an embodiment of a top ring and a substrate processing apparatus including the top ring according to the present invention together with accompanying drawings. In the accompanying drawings, the same or similar elements are denoted by the same or similar reference numerals, and duplicate description of the same or similar elements may be omitted in the description of each embodiment. Further, the features shown in each embodiment can be applied to other embodiments as long as they do not contradict each other.

FIG. 1 is a plan view illustrating an overall configuration of a substrate processing apparatus 1000 according to one embodiment. The substrate processing apparatus 10) illustrated in FIG. 1 includes a loading unit 100, a conveyance unit 200, a polishing unit 300, a drying unit 500, and an unloading unit 600. In the illustrated embodiment, the conveyance unit 200 includes two conveyance units 200A and 200B, and the polishing unit 300 includes two polishing units 300A and 300B. In the one embodiment, each of these units can be formed independently. By forming these units independently, arbitrarily combining the number of each unit can easily form the substrate processing apparatus 1000 having different configurations. Further, the substrate processing apparatus 1000 includes a control device 900, and each component of the substrate processing apparatus 1000 is controlled by the control device 900. In the one embodiment, the control device 900 can be constituted of a general computer including an input/output device, a computing device, a storage device, and the like.

<Loading Unit>

The loading unit 100 is a unit for introducing a substrate WF before processing, such as polishing and cleaning, is performed into the substrate processing apparatus 1000. In the one embodiment, the loading unit 100 is configured to comply with Mechanical Equipment Interface Standard (IPC-SMEMA-9851) of Surface Mount Equipment Manufacturers Association (SMEMA).

In the illustrated embodiment, a conveyance mechanism of the loading unit 100 includes a plurality of conveyance rollers 202 and a plurality of roller shafts 204 to which the conveyance rollers 202 are mounted. In the embodiment illustrated in FIG. 1, three conveyance rollers 202 are mounted on each roller shaft 204. The substrate WF is arranged on the conveyance rollers 202, and the substrate WF is conveyed by rotation of the conveyance rollers 202. The mounting positions of the conveyance rollers 202 on the roller shafts 204 can be arbitrary as long as the positions allow conveying the substrate WF stably. However, since the conveyance rollers 202 come into contact with the substrate WF, they should be arranged such that the conveyance rollers 202 come into contact with the area where no problem occurs even if coming into contact with the substrate WF to be processed. In the one embodiment, the conveyance rollers 202 of the loading unit 100 can be constituted of a conductive polymer. In the one embodiment, the conveyance rollers 202 are electrically grounded via the roller shafts 204 or the like. This avoids damage of the substrate WF due to being charged. Further, in the one embodiment, the loading unit 100 may be provided with an ionizer (not illustrated) to avoid charging of the substrate WF.

<Conveyance Unit>

The substrate processing apparatus 1000 illustrated in FIG. 1 includes the two conveyance units 200A and 200B. Since the two conveyance units 200A and 200B can have the same configuration, they will be described collectively as the conveyance unit 200 below.

The illustrated conveyance unit 200 includes the plurality of conveyance rollers 202 for conveying the substrate WF. By rotating the conveyance rollers 202, the substrate WF on the conveyance rollers 202 can be conveyed in a predetermined direction. The conveyance rollers 202 of the conveyance unit 200 may be formed of a conductive polymer or may be formed of a non-conductive polymer. The conveyance rollers 202 are driven by a motor (not illustrated). The substrate WF is conveyed to a substrate delivery position by the conveyance rollers 202.

In the one embodiment, the conveyance unit 200 includes cleaning nozzles 284. The cleaning nozzle 284 is connected to a supply source of a cleaning liquid (not illustrated). The cleaning nozzle 284 is configured to supply the cleaning liquid to the substrate WF conveyed by the conveyance rollers 202.

<Polishing Unit>

Figure 2:
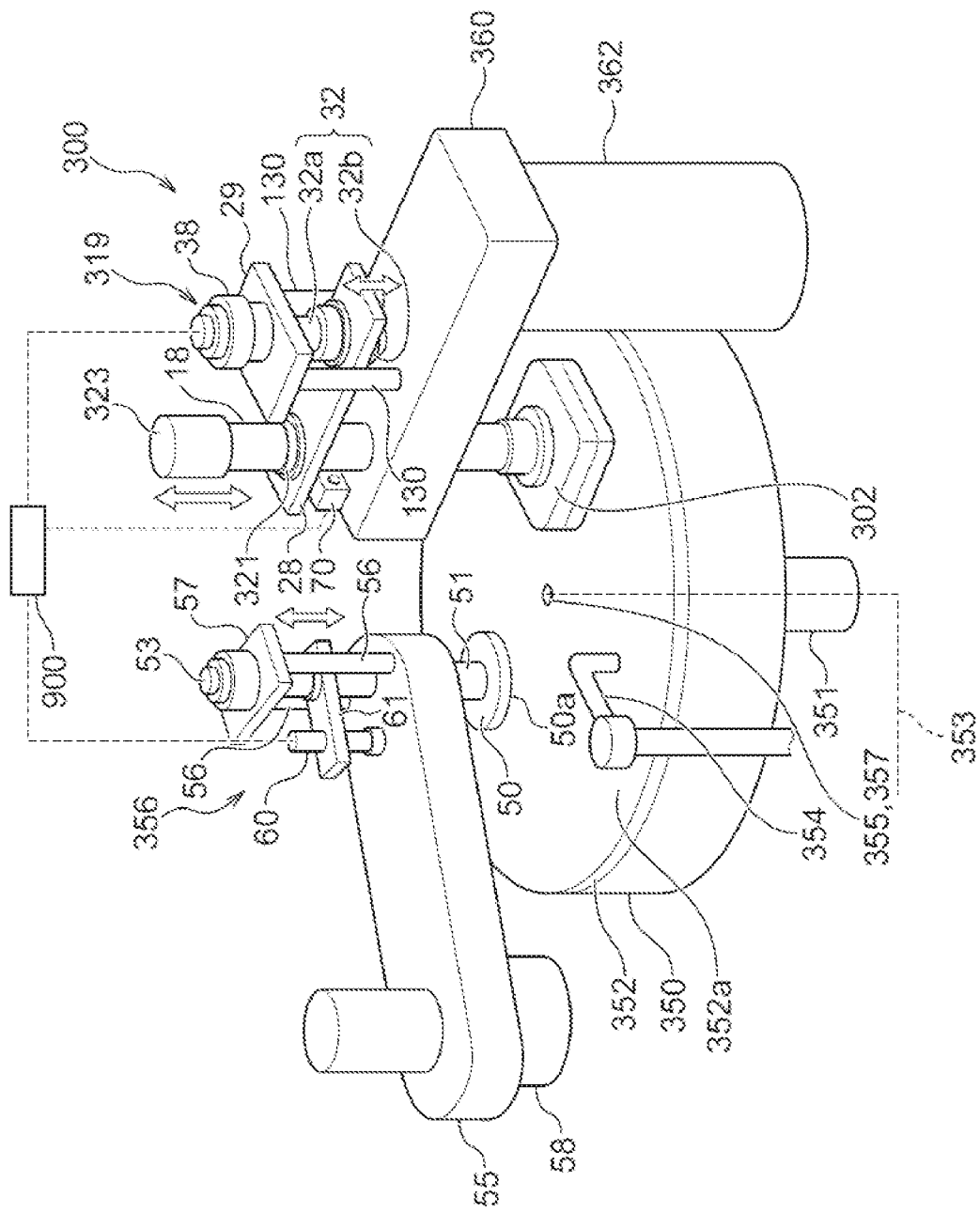
FIG. 2 is a perspective view schematically illustrating a configuration of a polishing unit according to the one embodiment.

FIG. 2 is a perspective view schematically illustrating a configuration of the polishing unit 300 according to the one embodiment. The substrate processing apparatus 1000 illustrated in FIG. 1 includes two polishing units 300A and 300B.

Since the two polishing units 300A and 300B can have the same configuration, they will be described collectively as the polishing unit 300 below.

As illustrated in FIG. 2, the polishing unit 300 includes a polishing table 350 and a top ring 302 constituting a polishing head that holds and presses the substrate to be polished against a polishing surface on the polishing table 350. The polishing table 350 is coupled to a polishing table rotation motor (not illustrated), arranged below a table shaft 351, via the table shaft 351 and is rotatable around the table shaft 351. A polishing pad 352 is attached to an upper surface of the polishing table 350, and a surface 352a of the polishing pad 352 constitutes a polishing surface that polishes the substrate. In the one embodiment, the polishing pad 352 may be attached via a layer for facilitating peeling from the polishing table 350. Such a layer includes, for example, a silicone layer or a fluorine-based resin layer, and for example, those described in Japanese Unexamined Patent Application Publication No. 2014-176950 may be used.

A polishing liquid supply nozzle 354 is installed above the polishing table 350, and the polishing liquid is supplied onto the polishing pad 352 on the polishing table 350 by the polishing liquid supply nozzle 354. Further, as illustrated in FIG. 2, the polishing table 350 and the table shaft 351 are provided with a passage 353 for supplying the polishing liquid. The passage 353 communicates with an opening portion 355 on the surface of the polishing table 350. A through hole 357 is formed in the polishing pad 352 at the position corresponding to the opening portion 355 of the polishing table 350, and the polishing liquid passing through the passage 353 is supplied from the opening portion 355 of the polishing table 350 and the through hole 357 of the polishing pad 352 to the surface of the polishing pad 352. Note that the numbers of the opening portion 355 of the polishing table 350 and the through hole 357 of the polishing pad 352 may be one or plural. Further, although the position of the opening portion 355 of the polishing table 350 and the through hole 357 of the polishing pad 352 is arbitrary, in the one embodiment, they are arranged near the center of the polishing table 350.

Although not illustrated in FIG. 2, in the one embodiment, the polishing unit 300 includes an atomizer 358 for injecting a liquid or a mixed fluid of a liquid and a gas toward the polishing pad 352 (see FIG. 1). The liquid injected from the atomizer 358 is, for example, pure water, and the gas is, for example, nitrogen gas.

The top ring 302 is connected to a top ring shaft 18, and the top ring shaft 18 moves vertically with respect to a swing arm 360 by an up-and-down motion mechanism 319. The vertical motion of the top ring shaft 18 causes the entire top ring 302 to move vertically with respect to the swing arm 360 for positioning. The top ring shaft 18 rotates by driving a top ring rotation motor (not illustrated). The rotation of the top ring shaft 18 causes the top ring 302 to rotate about the top ring shaft 18. Note that a rotary joint 323 is mounted to the upper end of the top ring shaft 18.

Note that there are various types of polishing pads available on the market, for example, SUBA800 ("SUBA" is a registered trademark), IC-1000, IC-1000/SUBA400 (double layer cloth) manufactured by Nitta Haas Co., Ltd., and Surfin xxx-5, Surfin 000, and the like ("Surfin" is a registered trademark) manufactured by Fujimi Incorporated are available. SUBA800, Surfin xxx-5, and Surfin 000 are non-woven fabrics in which fibers are hardened with urethane resin, and IC-1000 is a hard foamed polyurethane (single layer). The foamed polyurethane is porous and has a large number of fine dents or pores on its surface.

The top ring 302 can hold a quadrangular substrate on its lower surface. The swing arm 360 is configured to be turnable around a spindle 362. The top ring 302 can move between the substrate delivery position of the above-described conveyance unit 200 and the upper side of the polishing table 350 by the turn of the swing arm 360. By moving the top ring shaft 18 down, the top ring 302 can be moved down to press the substrate against the surface (polishing surface) 352a of the polishing pad 352. At this time, the top ring 302 and the polishing table 350 are each rotated, and the polishing liquid is supplied from the polishing liquid supply nozzle 354 disposed above the polishing table 350 and/or from the opening portion 355 disposed in the polishing table 350 onto the polishing pad 352. Thus, by pressing the substrate WF against the polishing surface 352a of the polishing pad 352, the surface of the substrate WF can be polished. During polishing of the substrate WF, the arm 360 may be fixed or swung such that the top ring 302 passes through the center of the polishing pad 352 (so as to cover the through hole 357 of the polishing pad 352).

The up-and-down motion mechanism 319, which vertically moves the top ring shaft 18 and the top ring 302, includes a bridge 28 that rotatably supports the top ring shaft 18 via a bearing 321, a ball screw 32 mounted to the bridge 28, a support table 29 supported by a support column 130, and an AC servo motor 38 disposed on the support table 29. The support table 29 that supports the servo motor 38 is secured to the swing arm 360 via the support column 130.

The ball screw 32 includes a screw shaft 32a coupled to the servo motor 38 and a nut 32b into which the screw shaft 32a is screwed. The top ring shaft 18 vertically moves integrally with the bridge 28. Therefore, when the servomotor 38 is driven, the bridge 28 vertically moves via the ball screw 32, whereby the top ring shaft 18 and the top ring 302 vertically move. The polishing unit 300 includes a ranging sensor 70 as a position detecting unit for detecting a distance to a lower surface of the bridge 28, that is, the position of the bridge 28. By detecting the position of the bridge 28 by the ranging sensor 70 the position of the top ring 302 can be detected. The ranging sensor 70 constitutes the up-and-down motion mechanism 319 together with the ball screw 32 and the servo motor 38. Note that the ranging sensor 70 may be a laser type sensor, an ultrasonic sensor, an overcurrent type sensor, or a linear scale type sensor. Further, each equipment in the polishing unit including the ranging sensor 70 and the servo motor 38 is configured to be controlled by the control device 900.

The polishing unit 300 according to the one embodiment includes a dressing unit 356 that dresses the polishing surface 352a of the polishing pad 352. The dressing unit 356 includes a dresser 50 that is slidably in contact with the polishing surface 352a, a dresser shaft 51 to which the dresser 50 is coupled, an air cylinder 53 disposed at an upper end of the dresser shaft 51, and a swing arm 55 that rotatably supports the dresser shaft 51. A lower portion of the dresser 50 is constituted by a dressing member 50a, and needle-shaped diamond particles are attached to a lower surface of the dressing member 50a. The air cylinder 53 is arranged on a support table 57 supported by support columns 56, and these support columns 56 are secured to the swing arm 55.

The swing arm 55 is configured to be driven by a motor (not illustrated) and turn around a spindle 58. The dresser shaft 51 rotates by driving of a motor (not illustrated), and the rotation of the dresser shaft 51 causes the dresser 50 to rotate around the dresser shaft 51. The air cylinder 53 vertically moves the dresser 50 via the dresser shaft 51 and presses the dresser 50 against the polishing surface 352*a* of the polishing pad 352 with a predetermined pressing force.

Dressing of the polishing surface 352*a* of the polishing pad 352 is performed in the following manner. The dresser 50 is pressed against the polishing surface 352*a* by the air cylinder 53, and at the same time, pure water is supplied to the polishing surface 352*a* from a pure water supply nozzle (not illustrated). In this state, the dresser 50 rotates around the dresser shaft 51, and the lower surface (diamond particles) of the dressing member 50*a* is brought into sliding contact with the polishing surface 352*a*. Thus, the dresser 50 scrapes off the polishing pad 352 and dresses the polishing surface 352*a*.

<Drying Unit>

The drying unit 500 is a device for drying the substrate WF. In the substrate processing apparatus 1000 illustrated in FIG. 1, the drying unit 500 dries the substrate WF which is cleaned by the cleaning unit of the conveyance unit 200 after being polished by the polishing unit 300. As illustrated in FIG. 1, the drying unit 500 is arranged downstream of the conveyance unit 200.

The drying unit 500 includes nozzles 530 for injecting gas toward the substrate WF being conveyed on the conveyance rollers 202. The gas can be, for example, compressed air or nitrogen. The substrate WF can be dried by blowing off water droplets on the conveyed substrate WF with the drying unit 500.

<Unloading Unit>

The unloading unit 600 is a unit for carrying out the substrate WF after processing, such as polishing and cleaning, is performed to outside of the substrate processing apparatus 1000. In the substrate processing apparatus 1000 illustrated in FIG. 1, the unloading unit 600 receives the substrate after being dried by the drying unit 500. As illustrated in FIG. 1, the unloading unit 600 is arranged downstream of the drying unit 500.

In the one embodiment, the unloading unit 600 is configured to comply with Mechanical Equipment Interface Standard (IPC-SMEMA-9851) of Surface Mount Equipment Manufacturers Association (SMEMA).

<Top Ring>

Figure 3:
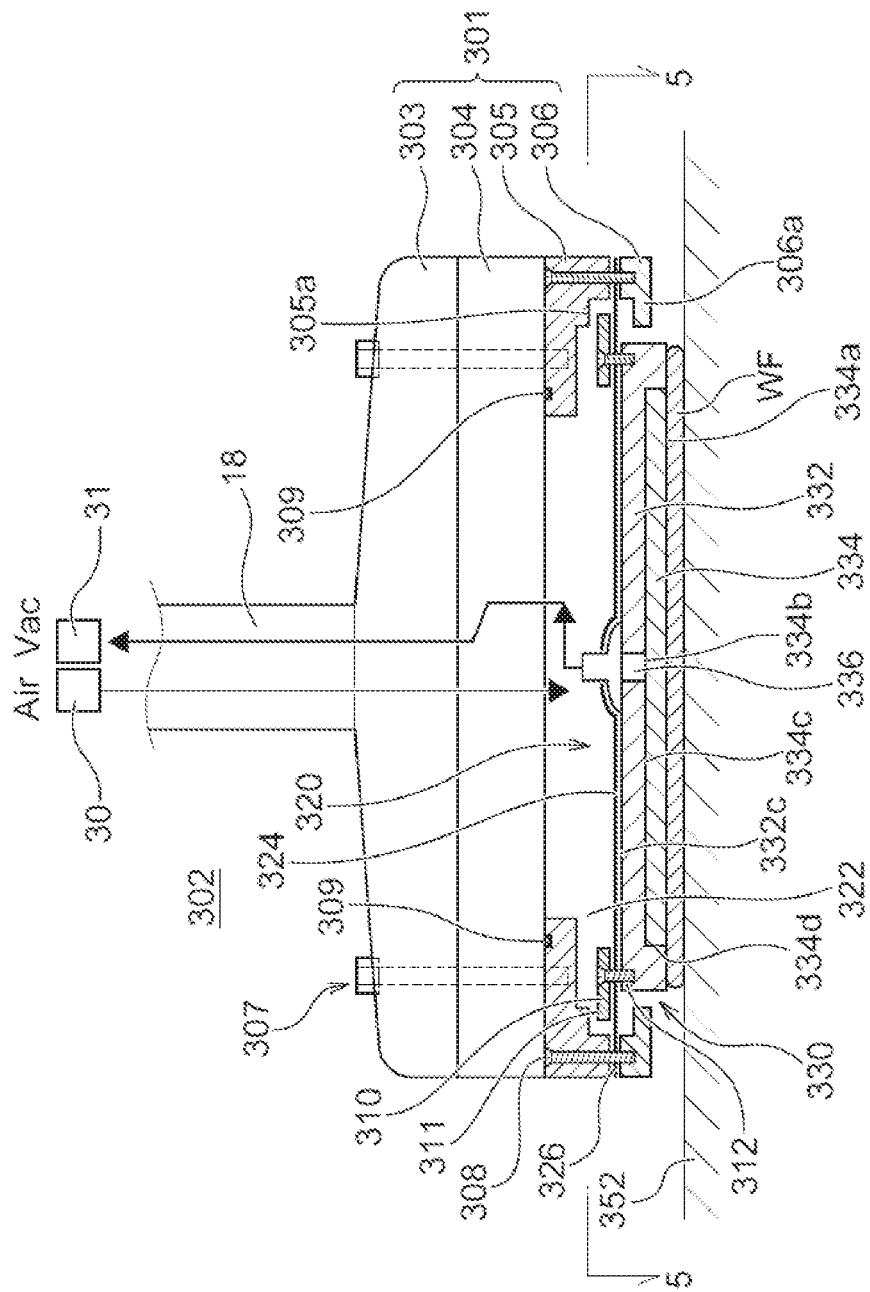
FIG. 3 is a cross-sectional view schematically illustrating a top ring according to the one embodiment.

Next, the top ring 302 in the polishing unit 300 according to the one embodiment will be described. FIG. 3 is a cross-sectional view schematically illustrating the top ring 302 according to the one embodiment. As illustrated in FIG. 3, the top ring 302 includes a base member 301 coupled to the top ring shaft (rotary shaft) 18. Specifically, the base member 301 is configured to include a flange 303 coupled to the top ring shaft (rotary shaft) 18, a spacer 304 mounted to a lower surface of the flange 303, a frame-shaped upper portion guiding member 305 mounted to a peripheral edge portion of a lower surface of the spacer 304, and a frame-shaped lower portion guiding member 306 mounted to a lower surface of the upper portion guiding member 305. The flange 303, the spacer 304, and the upper portion guiding member 305 are fastened by bolts 307. The upper portion guiding member 305 and the lower portion guiding member 306 are fastened by bolts 308.

The top ring 302 includes an elastic film 320 mounted to the base member 301 and a substrate suction member 330 held to the elastic film 320. The lower portion guiding member 306 is arranged so as to surround the substrate suction member 330. The elastic film 320 forms a pressurization chamber 322 for pressurizing the substrate WF between the base member 301 and the elastic film 320. The spacer 304 is coupled to the upper portion guiding member 305 via a sealing material 309, whereby air tightness of the pressurization chamber 322 is maintained. The elastic film 320 can be formed of a rubber material, for example but not limited to silicon rubber, ethylene propylene diene rubber (EPDM), or fluororubber (FKM). The elastic film 320 can be formed of a material which bears a load applied to the elastic film 320 due to weight of the substrate suction member 330 and the substrate WF when the substrate WF is conveyed, has a strength with which the elastic film 320 does not break in a range where motion of the substrate suction member 330 is limited by a stopper member 310 described later and the lower portion guiding member 306, and has an elasticity that allows having the degree of freedom in angle of the substrate suction member 330 with respect to the base member 301.

Figure 4:
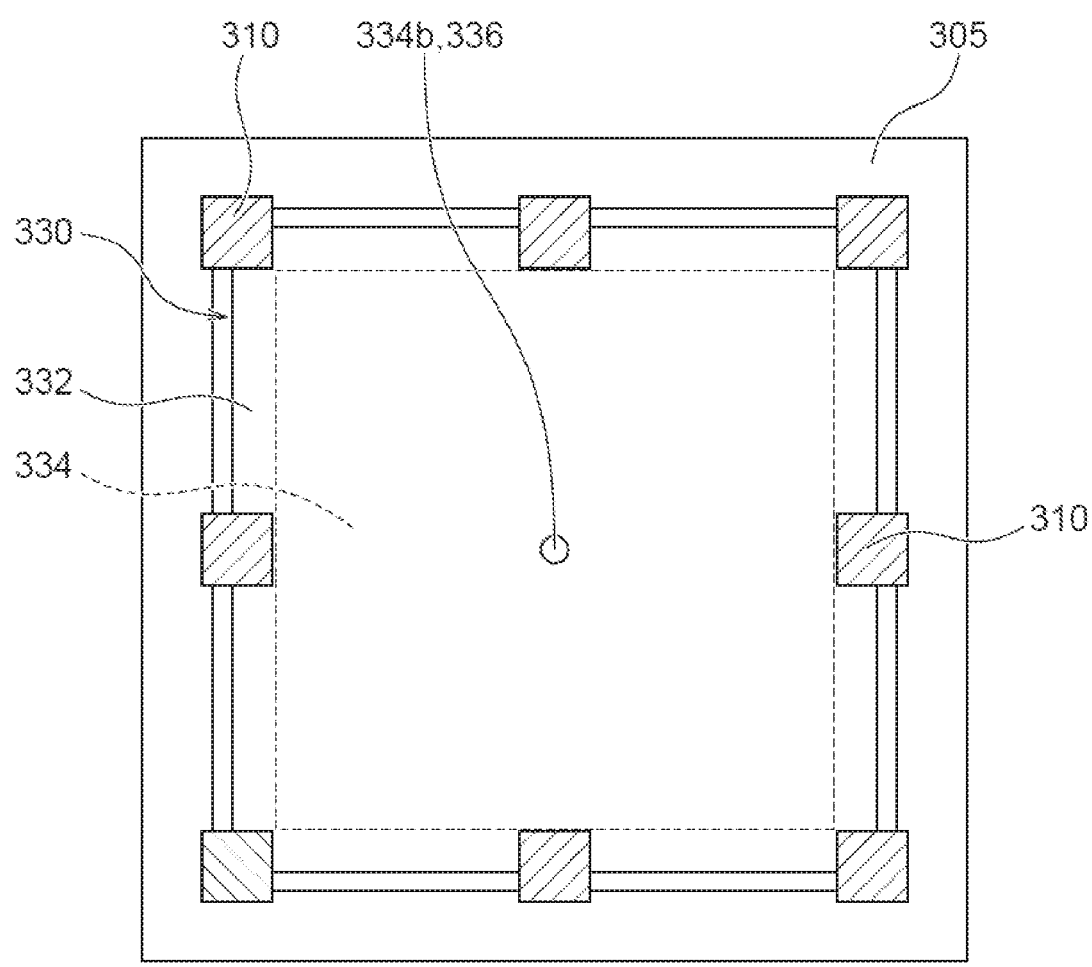
FIG. 4 is a view illustrating a cross section taken along the line 5-5 of FIG. 3.
Figure 5:
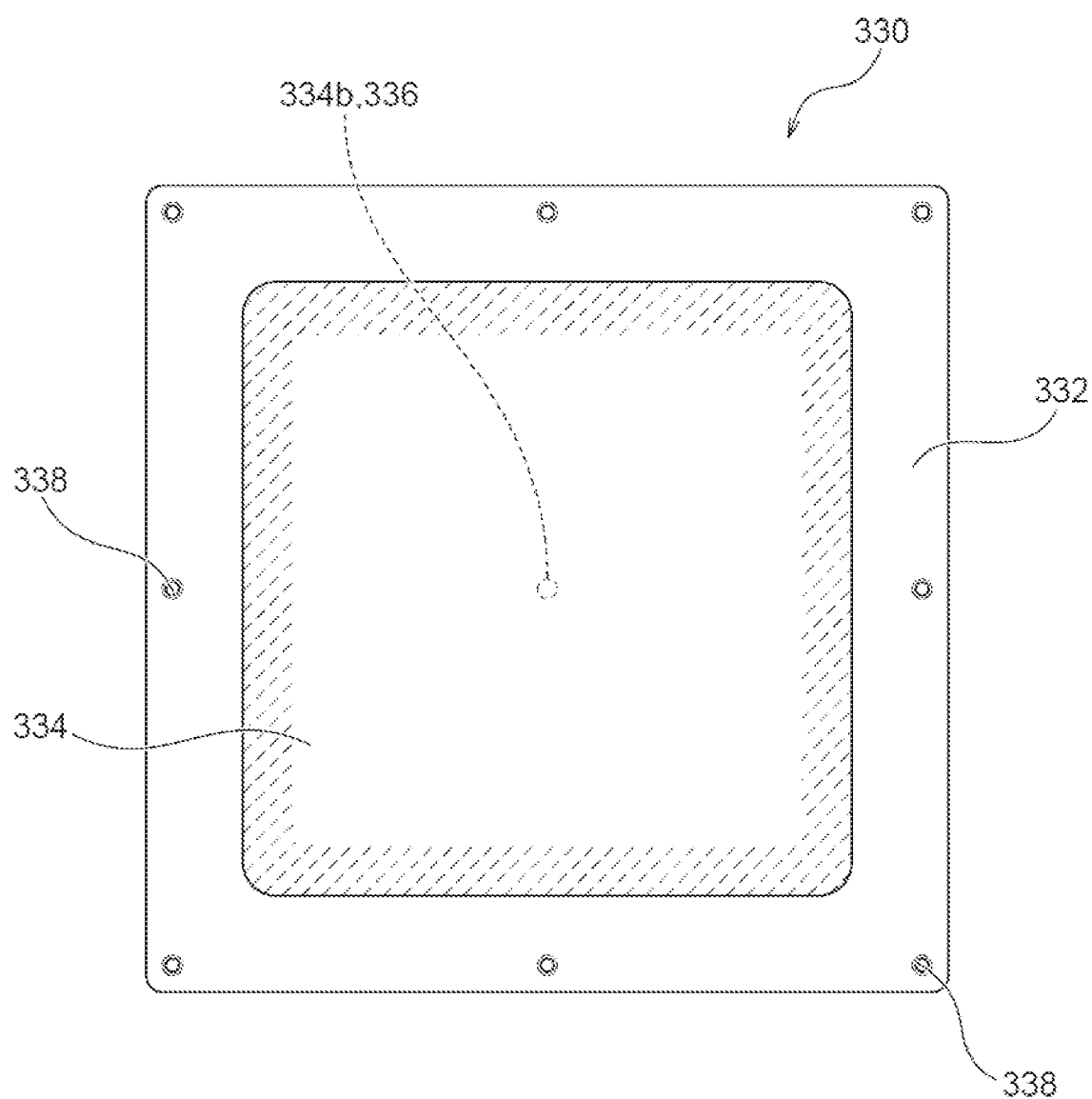
FIG. 5 is a plan view schematically illustrating a substrate suction member according to the one embodiment.
Figure 6:
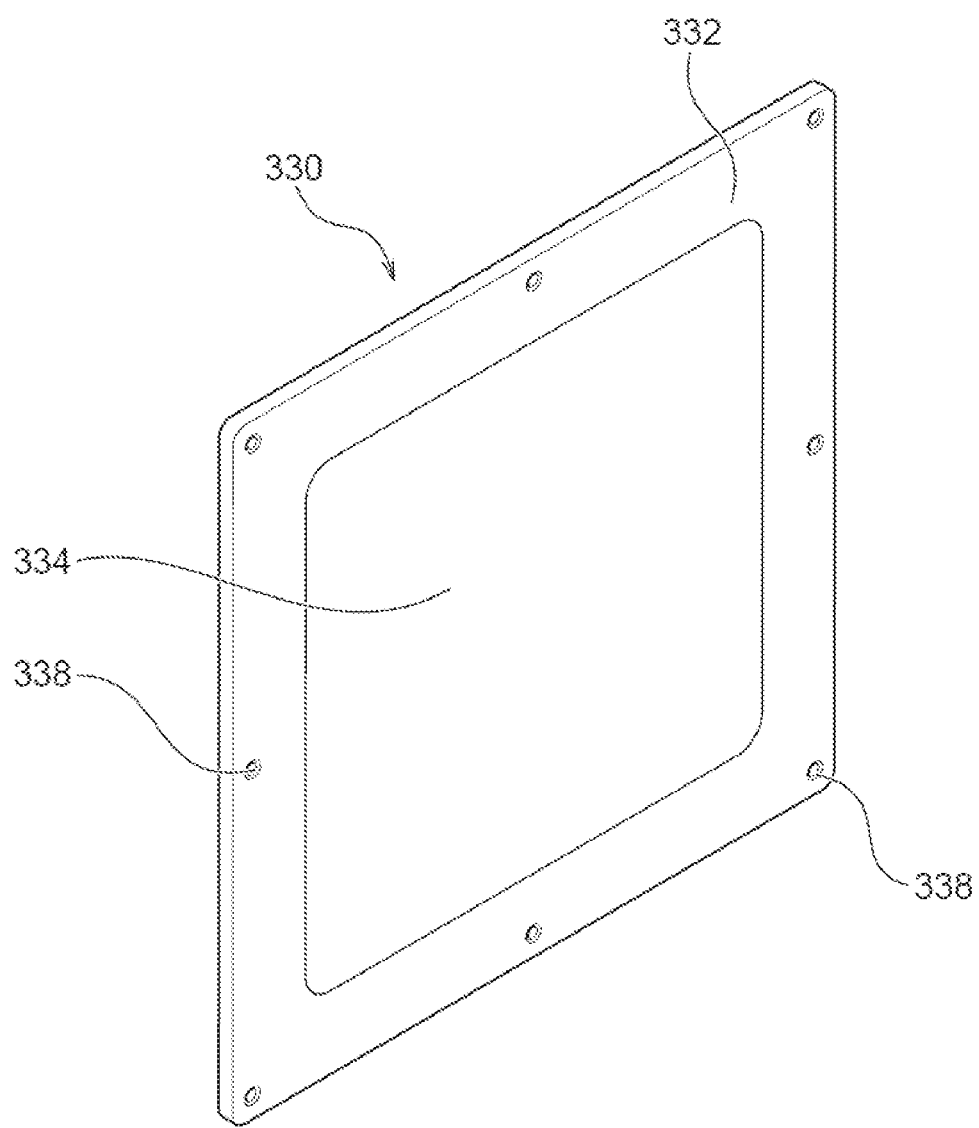
FIG. 6 is a perspective view schematically illustrating a substrate suction member according to the one embodiment.

FIG. 4 is a view illustrating across section taken along the line 5-5 of FIG. 3. FIG. 5 is a plan view schematically illustrating a substrate suction member according to the one embodiment. FIG. 6 is a perspective view schematically illustrating a substrate suction member according to the one embodiment. As illustrated in FIG. 3 to FIG. 6, the substrate suction member 330 includes a porous member 334 and a shielding member 332. It is only necessary that the porous member 334 is a member that can perform vacuum suction of the substrate WF by vacuum drawing using a pressure reducing unit (vacuum source) 31, and the porous member 334 can be constituted of, for example, a resin porous material. The porous member 334 is formed in a plate shape in this embodiment and includes a substrate suction surface 334*a* for suctioning the substrate WF and a pressure reducing portion 334*b* communicating with the pressure reducing unit (vacuum source) 31.

Figure 7:
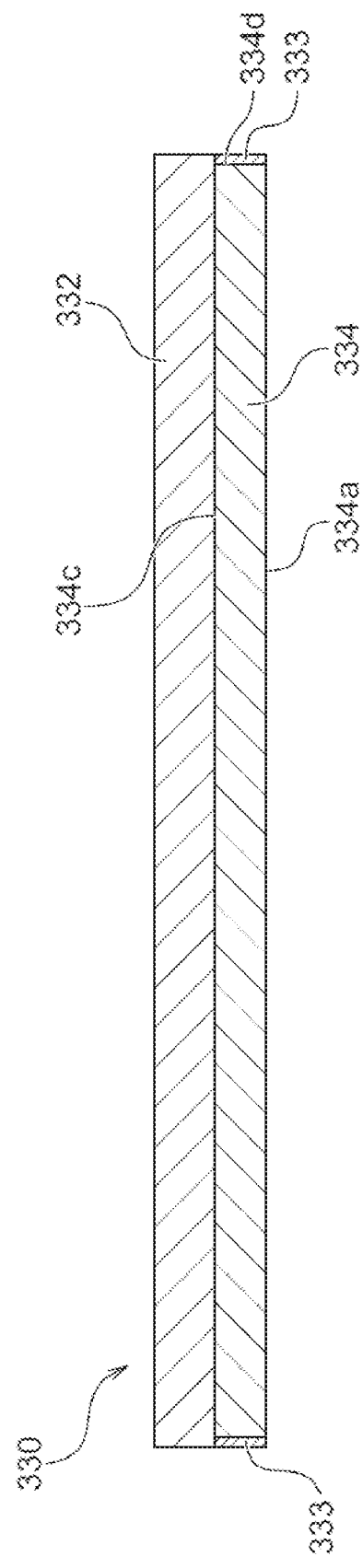
FIG. 7 is a view illustrating a modification of a substrate suction member.
Figure 8:
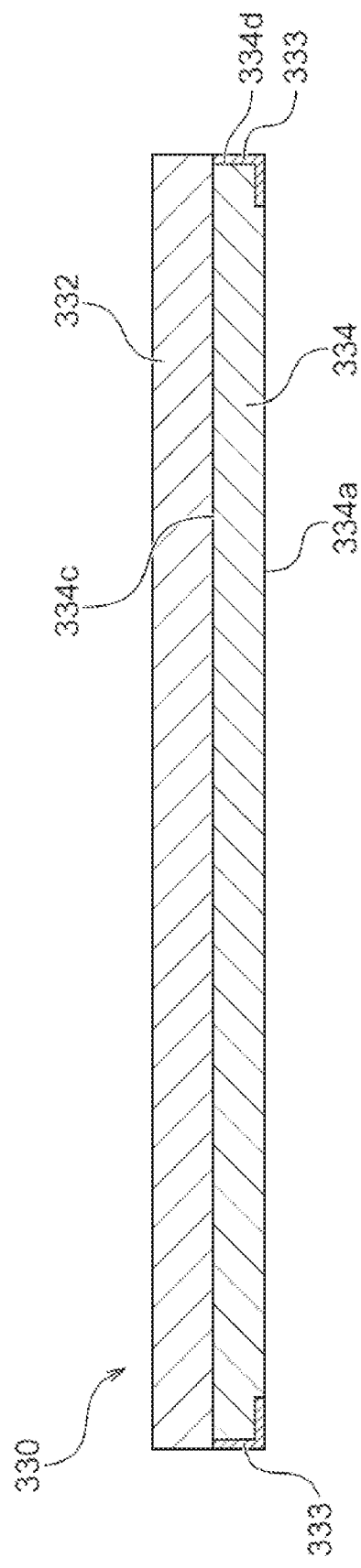
FIG. 8 is a view illustrating a modification of a substrate suction member.

It is only necessary that the shielding member 332 is an airtight member that can shield the flow of gas, and can be formed of, for example, a relatively soft resin plate, such as polyethylene (PE), polypropylene (PP), or polytetrafluoroethylene (PTFE). In this embodiment, the shielding member 332 is formed so as to shield a surface 334*c* of the porous member 334 on an opposite side of the substrate suction surface 334*a* and a side surface 334*d*. However, it is only necessary that the shielding member 332 is formed so as to shield at least the surface 334*c* of the porous member 334 on the opposite side of the substrate suction surface 334*a*. By providing the shielding member 332, when the porous member 334 is vacuum drawn by the pressure reducing unit (vacuum source) 31, negative pressure can be efficiently formed on the substrate suction surface 334*a*. This allows the substrate WF to be reliably suctioned to the substrate suction member 330, thus avoiding jumping out (slipping out) of the substrate WF to outside during polishing. FIG. 7 and FIG. 8 are views illustrating modifications of the substrate suction member 330. As illustrated in FIG. 7, the substrate suction member 330 may include the porous member 334, the shielding member 332 configured to shield the surface 334*c* of the porous member 334 on the opposite side of the substrate suction surface 334*a*, and a sealing material 333 configured to shield the side surface 334*d* of the porous member 334. The sealing material 333 may be a chemical resistant adhesive or the like and can fill a void on the side surface 334*d* for sealing. With this configuration, when the porous member 334 is vacuum drawn by the pressure reducing unit (vacuum source) 31, negative pressure can be efficiently formed on the substrate suction surface 334*a*, thus allowing suctioning the substrate WF reliably onto the substrate suction member 330. Further, as illustrated in FIG. 8, the substrate suction member 330 may include the porous member 334, the shielding member 332 configured to shield the surface 334*c* of the porous member 334 on the opposite side of the substrate suction surface 334a, and the sealing material 333 configured to shield the peripheral edge portion of the side surface 334d of the porous member 334 and the substrate suction surface 334a. With this configuration, when the porous member 334 is vacuum drawn by the pressure reducing unit (vacuum source) 31, air short pass can be reduced, and thus, suction force of the substrate WF against the substrate suction member 330 can be improved. Note that, in this embodiment, although the example in which the substrate suction member 330 includes the shielding member 332 has been shown, the substrate suction member 330 can be formed only by the porous member 334. In that case, it is preferred that the surfaces other than the substrate suction surface 334a of the porous member 334 or a hole 336 are treated by sealing similarly to the side surface 334d of the porous member 334 in FIG. 7 and FIG. 8.

The shielding member 332 includes the hole 336 formed so as to expose the porous member 334. The pressure reducing portion 334b of the porous member 334 is disposed at a position where the hole 336 is formed. Further, a plurality of holes 338 are formed at the end portion of the shielding member 332 along the circumferential direction. To the portions where the holes 338 are formed, the stopper members 310 described later are mounted.

The elastic film 320 includes a center portion 324 that covers a surface 332c of the substrate suction member 330 on the opposite side of the substrate suction surface 334a, and an end portion 326 that projects from the center portion 324 to outside of the substrate suction member 330. The end portion 326 is sandwiched between the upper portion guiding member 305 and the lower portion guiding member 306. The elastic film 320 has the end portion 326 secured between the upper portion guiding member 305 and the lower portion guiding member 306 in the circumferential direction. This forms the pressurization chamber 322 between the spacer 304 with the upper portion guiding member 305 and the elastic film 320. The pressurization chamber 322 communicates with a pressure adjustment portion 30. The pressure adjustment portion 30 has a pressure adjustment function for adjusting pressure of pressurized fluid supplied to the pressurization chamber 322. With this embodiment, the substrate WF is suctioned to the substrate suction surface 334a by making the porous member 334 negative pressure by using the pressure reducing unit 31, and the substrate WF can be pressed against the polishing pad 352 by pressurizing the pressurization chamber 322 by the pressure adjustment portion 30.

Further, the top ring 302 includes the plurality of stopper members 310 for restricting the movement in the vertical direction of the substrate suction member 330. The stopper member 310 is a plate-shaped member that is coupled to the substrate suction member 330 with the elastic film 320 sandwiched at the end portion of the substrate suction member 330. The stopper member 310 is coupled to the substrate suction member 330 by screwing a bolt 312 into the hole 338 of the shielding member 332. The stopper member 310 includes a flange portion 311 that projects outward with respect to the substrate suction member 330.

On the other hand, the upper portion guiding member 305 and the lower portion guiding member 306 have regulating surfaces 305a and 306a that restrict the movement in the vertical direction of the stopper member 310 by abutting on the flange portion 311 of the stopper member 310. When the substrate suction member 330 moves in the upward direction, the flange portion 311 comes into contact with the regulating surface 305a to restrict the movement in the upward direction of the substrate suction member 330. On the other hand, when the substrate suction member 330 moves in the downward direction, the flange portion 311 comes into contact with the regulating surface 306a to restrict the movement in the downward direction of the substrate suction member 330. This allows restricting a range of the movement in the vertical direction of the substrate suction member 330 to a desired range.

With this embodiment, even when the top ring 302 or the polishing table 350 to which the polishing pad 352 is attached is tilted due to manufacturing tolerance or the like of each component constituting the substrate processing apparatus 1000, the substrate WF can be uniformly pressed against the polishing pad 352. That is, according to this embodiment, the substrate suction member 330 is not secured to the base member 301 but is held to the elastic film 320. In view of this, even if the top ring 302 or the polishing table 350 is tilted and the substrate WF partially contacts the polishing pad 352, the elasticity of the elastic film 320 causes the substrate suction member 330 to align with the polishing surface of the polishing pad 352, and as a result, the substrate WF can be brought into contact with the polishing pad 352 in parallel. Therefore, with this embodiment, the substrate WF can be uniformly pressed against the polishing pad 352.

Further, in this embodiment, the lower portion guiding member 306 is arranged around the substrate suction member 330. Therefore, with this embodiment, the force laterally applied on the substrate suction member 330 during polishing of the substrate WF can be supported by the lower portion guiding member 306. Further, with this embodiment, since the substrate WF can be suctioned by the substrate suction member 330, without providing a retainer member for avoiding the jumping out (slipping out) of the substrate WF to outside during polishing, the slipping out of the substrate WF can be avoided. In particular, as the substrate WF has been thinned in recent years, there is a possibility that the substrate WF slips out during polishing even when the retainer member is provided. Further, when the shape of the substrate WF is quadrangular, there were a possibility that the corner portions of the substrate WF could come into contact with the retainer member during polishing, and the substrate WF or a top ring could be damaged. In contrast to this, with this embodiment, since the substrate WF can be pressed against the polishing pad 352 while being vacuum suctioned by the substrate suction member 330, the slipping out of the substrate WF during polishing can be avoided and the substrate WF or the top ring 302 can be avoided from being damaged during polishing.

Figure 9:
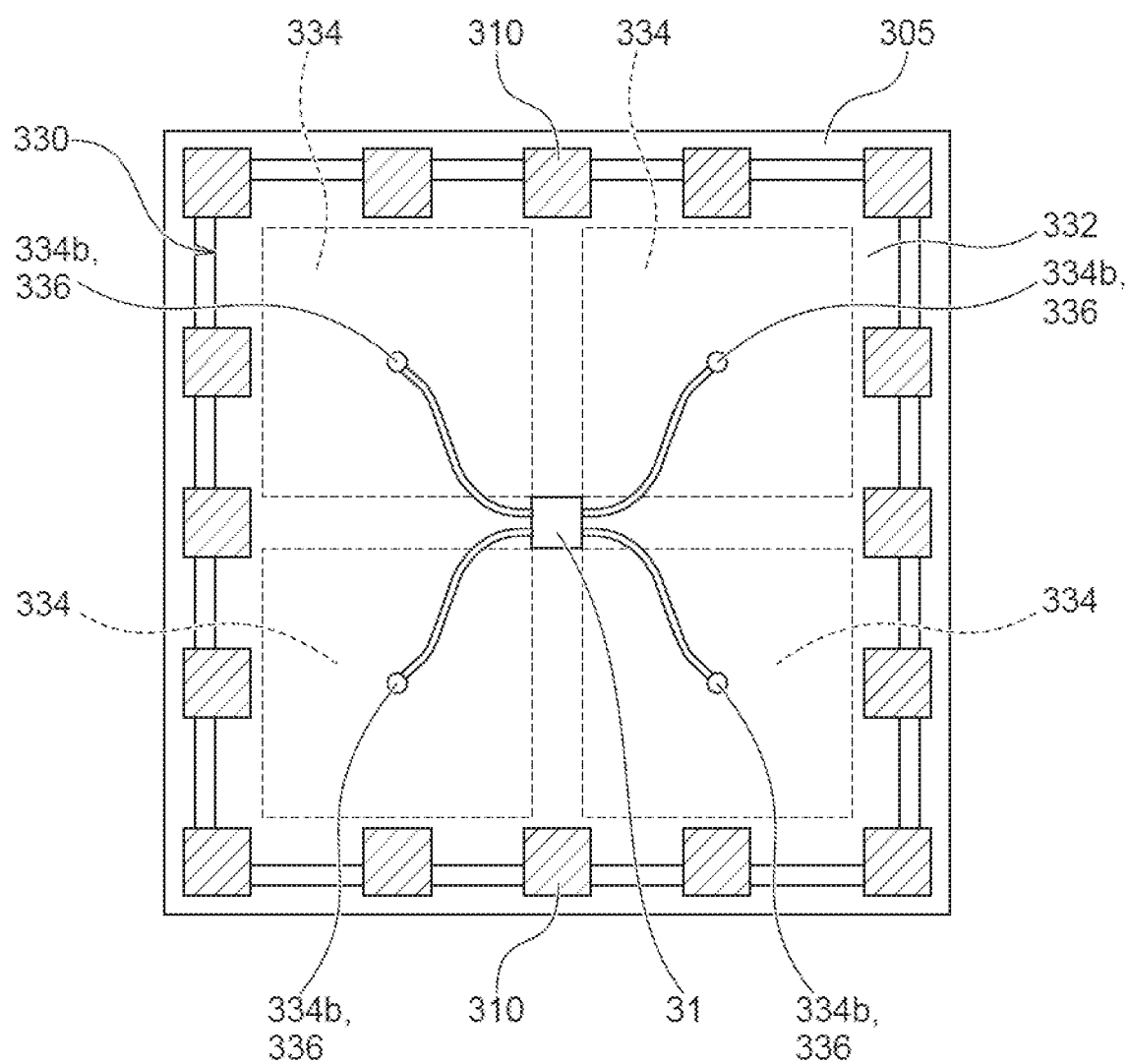
FIG. 9 is a plan view schematically illustrating a substrate suction member according to the one embodiment.

Next, a modification of the top ring 302 of this embodiment will be described. FIG. 9 is a plan view schematically illustrating a substrate suction member according to the one embodiment. As illustrated in FIG. 9, the substrate suction member 330 may have a plurality of pressure reducing portions 334b. Specifically, the substrate suction member 330 includes a plurality of porous members 334, and the shielding member 332 configured to shield the surfaces 334c of the plurality of porous members 334 on the opposite side of the respective substrate suction surfaces 334a. The shielding member 332 includes a plurality of holes 336 formed so as to expose the respective plurality of porous members 334. The respective pressure reducing portions 334b are disposed at the positions where the plurality of holes 336 are formed.

By providing the substrate suction member 330 with the plurality of pressure reducing portions 334b in this way, the entire substrate suction member 330 can be decompressed by the pressure reducing unit (vacuum source) 31. As a result, even when the substrate WF is large, the substrate WF can be firmly suctioned to the substrate suction member 330, thus allowing the substrate WF to be avoided from slipping out of the top ring 302 during polishing. In this embodiment, an example in which one pressure reducing portion 334b and one hole 336 are provided for each of the plurality of porous members 334 is shown, but it is not limited this. For example, as illustrated in FIG. 3, in the substrate suction member 330 having one porous member 334, a plurality of pressure reducing portions 334b may be provided for the one porous member 334 by forming a plurality of holes 336 in the shielding member 332. With this configuration, even when the substrate WF is large and the porous member 334 is large, the substrate WF can be uniformly suctioned to the substrate suction member 330.

Figure 10:
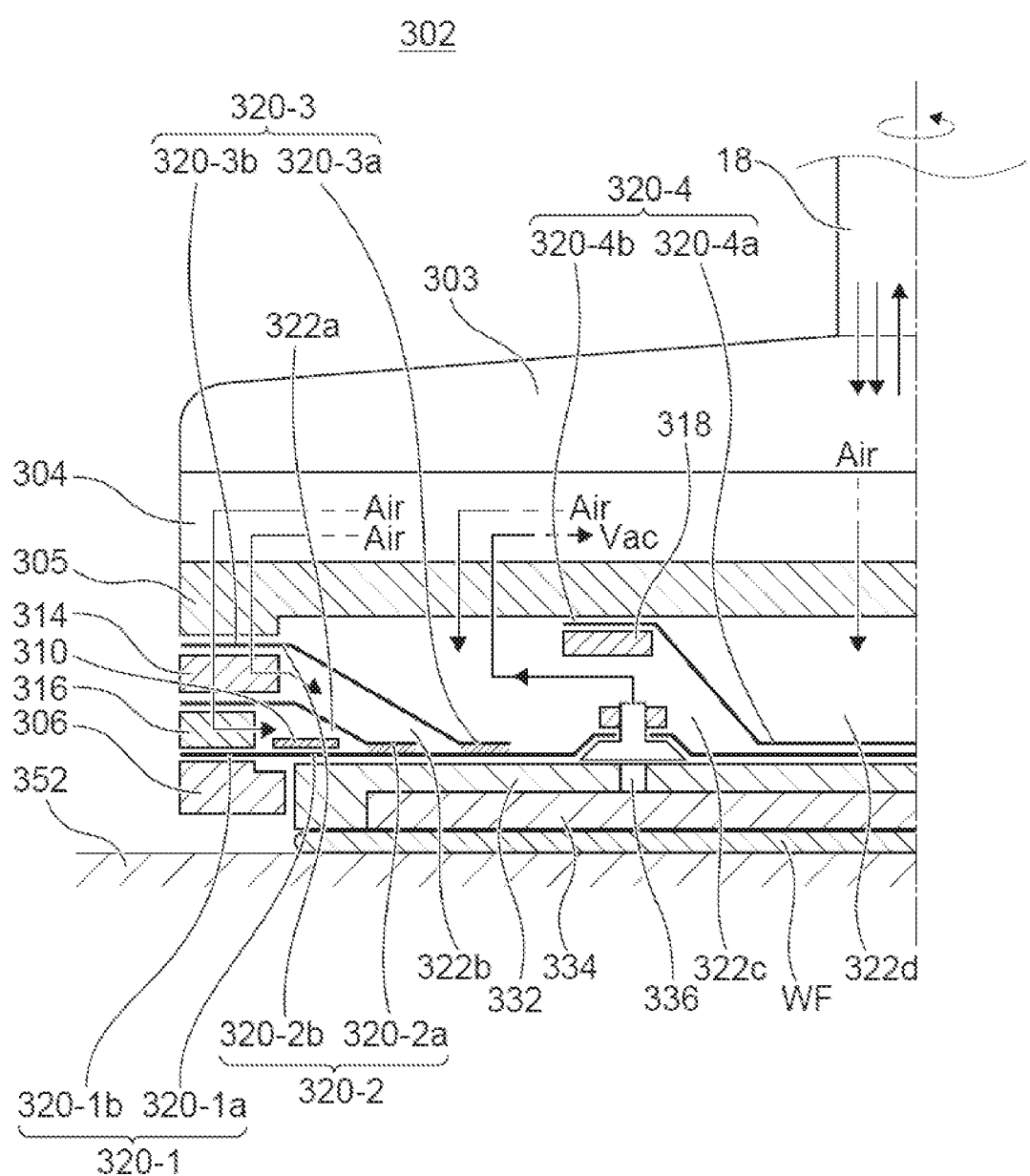
FIG. 10 is a cross-sectional view schematically illustrating a part of a top ring according to the one embodiment.

Next, a modification of the top ring 302 of this embodiment will be described. FIG. 10 is a cross-sectional view schematically illustrating a part of the top ring 302 according to the one embodiment. As illustrated in FIG. 10, in the top ring 302 of this embodiment, a frame-shaped first elastic film spacer 314 and a frame-shaped second elastic film spacer 316 are disposed between the upper portion guiding member 305 and the lower portion guiding member 306 in the vertical direction. Further, a frame-shaped or annular-shaped elastic film holder 318 is mounted to a lower surface of the center portion of the upper portion guiding member 305. The first elastic film spacer 314, the second elastic film spacer 316, and the elastic film holder 318 can be regarded as members constituting the base member 301.

On the other hand, the elastic film 320 includes a plurality of pieces of elastic films 320-1, 320-2, 320-3, and 320-4. The elastic films 320-1, 320-2, 320-3, and 320-4 each include a center portion that is connected to the surface 332c of the substrate suction member 330 on the opposite side of the substrate suction surface 334a, and an end portion that extends from the center portion and is secured to a different position of the base member 301.

Specifically, in the elastic film 320-1, a center portion 320-1a is connected to the surface 332c of the substrate suction member 330 on the opposite side of the substrate suction surface 334a, and an end portion 320-1b is sandwiched between the second elastic film spacer 316 and the lower portion guiding member 306. In the elastic film 320-2, a center portion 320-2a is connected to the center portion 320-1a of the elastic film 320-1, and an end portion 320-2b is sandwiched between the first elastic film spacer 314 and the second elastic film spacer 316. In the elastic film 320-3, the center portion 320-3a is connected to the center portion 320-1a of the elastic film 320-1, and the end portion 320-3b is sandwiched between the upper portion guiding member 305 and the first elastic film spacer 314. In the elastic film 320-4, the center portion 320-4a is connected to the center portion 320-1a of the elastic film 320-1, and the end portion 320-4b is sandwiched between the upper portion guiding member 305 and the elastic film holder 318.

With such a structure of the plurality of elastic films 320-1, 320-2, 320-3, and 320-4, a plurality of pressurization chambers 322a, 322b, 322c, and 322d for pressurizing the substrate WF are formed between the base member 301 and the plurality of pieces of elastic films 320-1, 320-2, 320-3, and 320-4.

According to this embodiment, by forming the plurality of concentric pressurization chambers 322a, 322b, 322c, and 322d, the pressing force of the substrate WF against the polishing pad 352 can be controlled for each area. Further, according to this embodiment, since the substrate suction member 330 has a certain degree of elasticity (to the extent that the pressure difference of each pressurization chamber can be reflected in the substrate pressing pressure difference), profile control becomes possible by applying a different pressure to each pressurization chamber.

Figure 11:
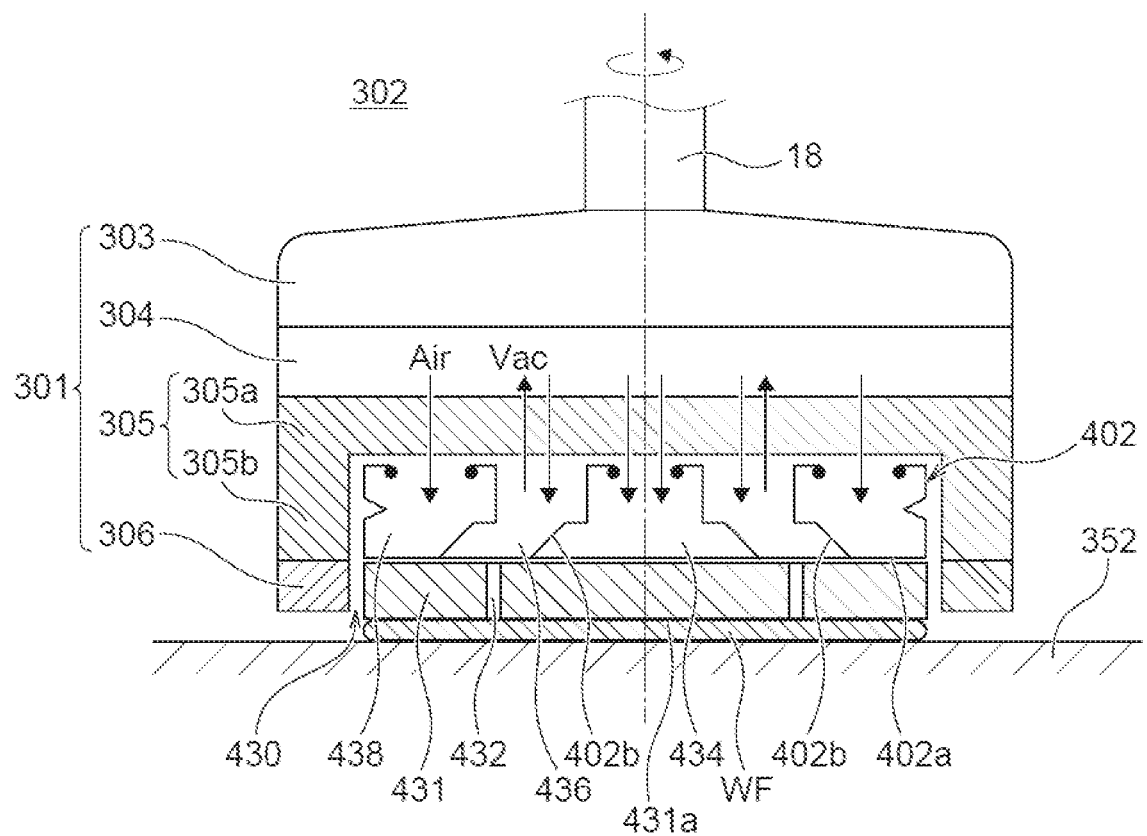
FIG. 11 is a cross-sectional view schematically illustrating a top ring according to the one embodiment.

FIG. 11 is a cross-sectional view schematically illustrating the top ring 302 according to the one embodiment. As illustrated in FIG. 11, the top ring 302 of this embodiment includes the base member 301 coupled to the top ring shaft (rotary shaft) 18. Specifically, the base member 301 is configured to include the flange 303 coupled to the top ring shaft (rotary shaft) 18, the spacer 304 mounted to a lower surface of the flange 303, the upper portion guiding member 305 including a plate-shaped member 305a mounted to a lower surface of the spacer 304 and a frame-shaped member 305b disposed on the peripheral edge portion of a lower surface of the plate-shaped member 305a and the frame-shaped lower portion guiding member 306 mounted to a lower surface of the frame-shaped member 305b.

Further, the top ring 302 includes an elastic film 402 mounted to the base member 301. The elastic film 402 includes abase film 402a disposed in a space formed by the upper portion guiding member 305, and a plurality of partition walls 402b formed concentrically on the base film 402a. The upper end portions of the plurality of partition walls 402b are secured to the plate-shaped member 305a. This forms a plurality of concentric pressurization chambers 434, 436, and 438 for pressurizing the substrate WF between the elastic film 402 and the base member 301. By forming the pressurization chambers 434, 436, and 438, the pressing force of the substrate WF against the polishing pad 352 can be controlled for each area.

The top ring 302 includes a substrate holding member 430 held to the elastic film 402. The substrate holding member 430 can be attached to a lower surface of the base film 402a. The substrate holding member 430 includes an elastic plate-shaped member 431 in which a substrate holding surface 431a for holding the substrate WF is mirror-finished. The elastic plate-shaped member 431 can be formed of a rubber material, such as silicon rubber, ethylene propylene diene rubber (EPDM), or fluororubber (FKM). The substrate holding surface 431a is mirror-finished so as to hold the substrate WF. Here, the mirror-finished surface is a surface having an arithmetic mean roughness Ra of less than or equal to 5 μm. In one example, the substrate holding member 430 can be molded using a mold configured such that the arithmetic mean roughness Ra of the substrate holding surface 431a becomes less than or equal to 5 μm. Note that the elastic film 402 and the substrate holding member 430 can be integrally molded of the same material. In this case, it is not necessary to attach the elastic film 402 and the substrate holding member 430.

According to this embodiment, by mirror-finishing the substrate holding surface 431a of the substrate holding member 430, the friction force between the substrate WF and the substrate holding surface 431a is improved and the substrate WF can be held on the substrate holding surface 431a. As a result, according to this embodiment, without using the retainer member for guarding the periphery of the substrate WF, the slipping out of the substrate WF during polishing can be avoided.

Further, in this embodiment, the lower portion guiding member 306 is arranged around the substrate holding member 430. Therefore, with this embodiment, during polishing of the substrate WF, the force laterally applied on the substrate holding member 430 can be supported by the lower portion guiding member 306.

In the substrate holding member 430, a plurality of holes 432 passing through the substrate holding surface 431a and the surface on the opposite side of the substrate holding surface 431*a* are formed. By forming the holes 432, the pressurization chamber 436 is switched to be negative pressure when the substrate WF is conveyed between the conveyance unit 200 and the polishing unit 300, allowing the substrate WF to be chucked to the substrate holding member 430. Further, after the substrate WF is polished and conveyed to the conveyance unit 200, the substrate WF held to the substrate holding member 430 can be easily removed by applying, for example, air pressure from the holes 432.

Figure 12:
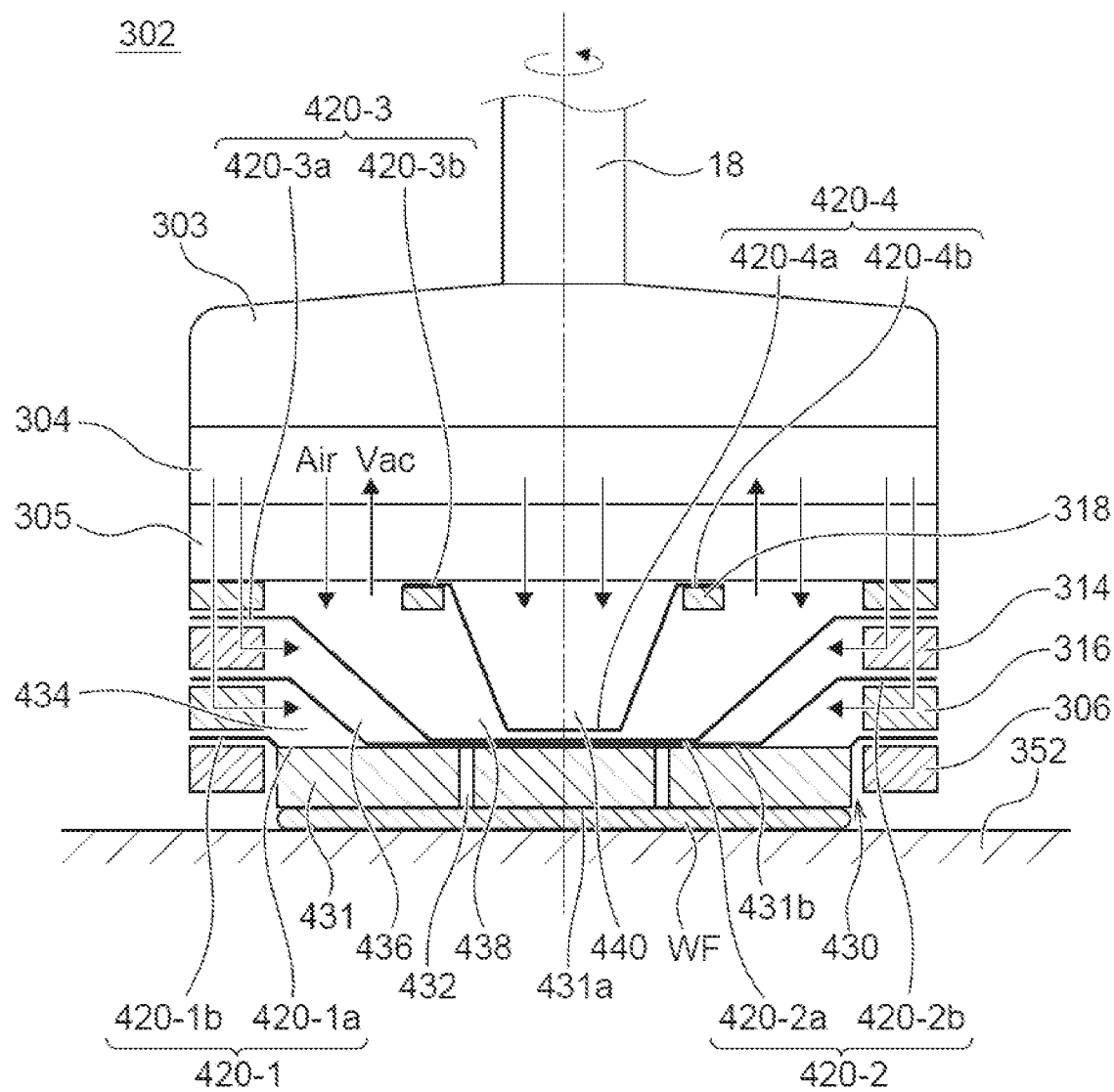
FIG. 12 is a cross-sectional view schematically illustrating a top ring according to the one embodiment.

FIG. 12 is a cross-sectional view schematically illustrating the top ring 302 according to the one embodiment. The top ring 302 illustrated in FIG. 12 is different in the structure of the elastic film, and identical in other structures, compared with the top ring 302 illustrated in FIG. 11. Therefore, only the structure different from the top ring 302 illustrated in FIG. 11 will be described.

As illustrated in FIG. 12, the top ring 302 of this embodiment is provided with the frame-shaped first elastic film spacer 314 and the frame-shaped second elastic film spacer 316 between the upper portion guiding member 305 and the lower portion guiding member 306 in the vertical direction. Further, the frame-shaped or annular-shaped elastic film holder 318 is mounted to the lower surface of the center portion of the upper portion guiding member 305. The first elastic film spacer 314, the second elastic film spacer 316, and the elastic film holder 318 can be regarded as the members constituting the base member 301.

An elastic film 420 includes a plurality of pieces of elastic films 420-1, 420-2, 420-3, and 420-4. The elastic films 420-1, 420-2, 420-3, and 420-4 include center portions that are connected to a surface 431*b* of the substrate holding member 430 on the opposite side of the substrate holding surface 431*a*, and end portions that are secured to different positions of the base member 301.

Specifically, in the elastic film 420-1, a center portion 420-1*a* is connected to the surface 431*b* of the substrate holding member 430 on the opposite side of the substrate holding surface 431*a*, and an end portion 420-1*b* is sandwiched between the second elastic film spacer 316 and the lower portion guiding member 306. In the elastic film 420-2, a center portion 420-2*a* is connected to the center portion 420-1*a* of the elastic film 420-1, and an end portion 420-2*b* is sandwiched between the first elastic film spacer 314 and the second elastic film spacer 316. In the elastic film 420-3, the center portion 420-3*a* is connected to the center portion 420-2*a* of the elastic film 420-2, and the end portion 420-3*b* is sandwiched between the upper portion guiding member 305 and the first elastic film spacer 314. In the elastic film 420-4, the center portion 420-4*a* is connected to the center portion 420-3*a* of the elastic film 420-3, and the end portion 420-4*b* is sandwiched between the upper portion guiding member 305 and the elastic film holder 318. Note that the elastic film 420-1 and the substrate holding member 430 can be integrally molded of the same material. In this case, it is not necessary to connect the elastic film 420-1 to the substrate holding member 430.

With such a structure of the plurality of elastic films 420-1, 420-2, 420-3, and 420-4, a plurality of pressurization chambers 434, 436, 438, and 440 for pressurizing the substrate WF are formed between the base member 301 and the plurality of pieces of elastic films 420-1, 420-2, 420-3, and 420-4.

According to this embodiment, by forming the plurality of concentric pressurization chambers 434, 436, 438, and 440, the pressing force of the substrate WF against the polishing pad 352 can be controlled for each area. Further, according to this embodiment, since the elastic plate-shaped member 431 has a certain degree of elasticity (to the extent that the pressure difference of each pressurization chamber can be reflected in the substrate pressing pressure difference) although having thickness, profile control is allowed by applying a different pressure to each pressurization chamber.

Figure 13:
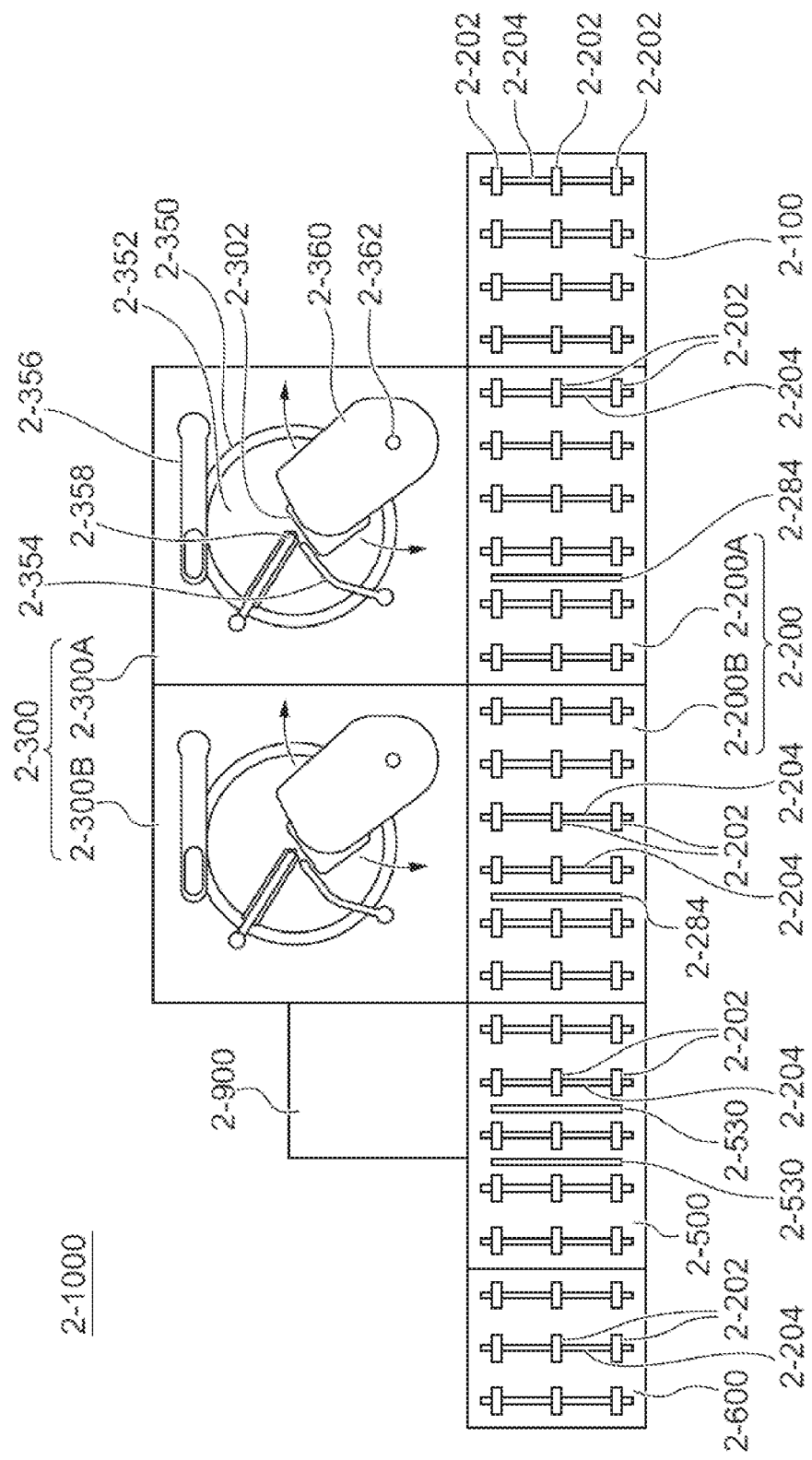
FIG. 13 is a plan view illustrating an overall configuration of a substrate processing apparatus according to one embodiment.

FIG. 13 is a plan view illustrating an overall configuration of a substrate processing apparatus 2-1000 according to the one embodiment. The substrate processing apparatus 2-1000 illustrated in FIG. 13 includes a loading unit 2-100, a conveyance unit 2-200, a polishing unit 2-300, a drying unit 2-500, and an unloading unit 2-600. In the illustrated embodiment, the conveyance unit 2-200 includes two conveyance units 2-200A and 2-200B, and the polishing unit 2-300 includes two polishing units 2-300A and 2-300B. In the one embodiment, each of these units can be formed independently. By forming these units independently, arbitrarily combining the number of each unit can easily form the substrate processing apparatus 2-1000 having different configurations. Further, the substrate processing apparatus 2-1000 includes a control device 2-900, and each component of the substrate processing apparatus 2-1000 is controlled by the control device 2-9(*x*). In the one embodiment, the control device 2-900 can be constituted of a general computer including an input/output device, a computing device, a storage device, and the like.

<Loading Unit>

The loading unit 2-100 is a unit for introducing a substrate WF before processing, such as polishing and cleaning, is performed into the substrate processing apparatus 2-1000. In the one embodiment, the loading unit 2-100 is configured to comply with Mechanical Equipment Interface Standard (IPC-SMEMA-9851) of Surface Mount Equipment Manufacturers Association (SMEMA).

In the illustrated embodiment, a conveyance mechanism of the loading unit 2-100 includes a plurality of conveyance rollers 2-202 and a plurality of roller shafts 2-204 to which the conveyance rollers 2-202 are mounted. In the embodiment illustrated in FIG. 13, three conveyance rollers 2-202 are mounted on each roller shaft 2-204. The substrate WF is arranged on the conveyance rollers 2-202, and the substrate WF is conveyed by rotation of the conveyance rollers 2-202. The mounting positions of the conveyance rollers 2-202 on the roller shafts 2-204 can be arbitrary as long as the positions allow conveying the substrate WF stably. However, since the conveyance rollers 2-202 come into contact with the substrate WF, they should be arranged such that the conveyance rollers 2-202 come into contact with the area where no problem occurs even if coming into contact with the substrate WF to be processed. In the one embodiment, the conveyance rollers 2-202 of the loading unit 2-100 can be constituted of a conductive polymer. In the one embodiment, the conveyance rollers 2-202 are electrically grounded via the roller shafts 2-204 or the like. This avoids damage of the substrate WF due to being charged. Further, in the one embodiment, the loading unit 2-100 may be provided with an ionizer (not illustrated) to avoid charging of the substrate WF.

<Conveyance Unit>

The substrate processing apparatus 2-1000 illustrated in FIG. 13 includes the two conveyance units 2-200A and 2-200B. Since the two conveyance units 2-200A and 2-200B can have the same configuration, they will be described collectively as the conveyance unit 2-200 below.

The illustrated conveyance unit 2-200 includes the plurality of conveyance rollers 2-202 for conveying the substrate WF. By rotating the conveyance rollers 2-202, the substrate WF on the conveyance rollers 2-202 can be conveyed in a predetermined direction. The conveyance rollers 2-202 of the conveyance unit 2-200 may be formed of a conductive polymer or may be formed of a non-conductive polymer. The conveyance rollers 2-202 are driven by a motor (not illustrated). The substrate WF is conveyed to a substrate delivery position by the conveyance rollers 2-202.

In the one embodiment, the conveyance unit 2-200 includes cleaning nozzles 2-284. The cleaning nozzle 2-284 is connected to a supply source of a cleaning liquid (not illustrated). The cleaning nozzle 2-284 is configured to supply the cleaning liquid to the substrate WF conveyed by the conveyance rollers 2-202.

<Polishing Unit>

Figure 14:
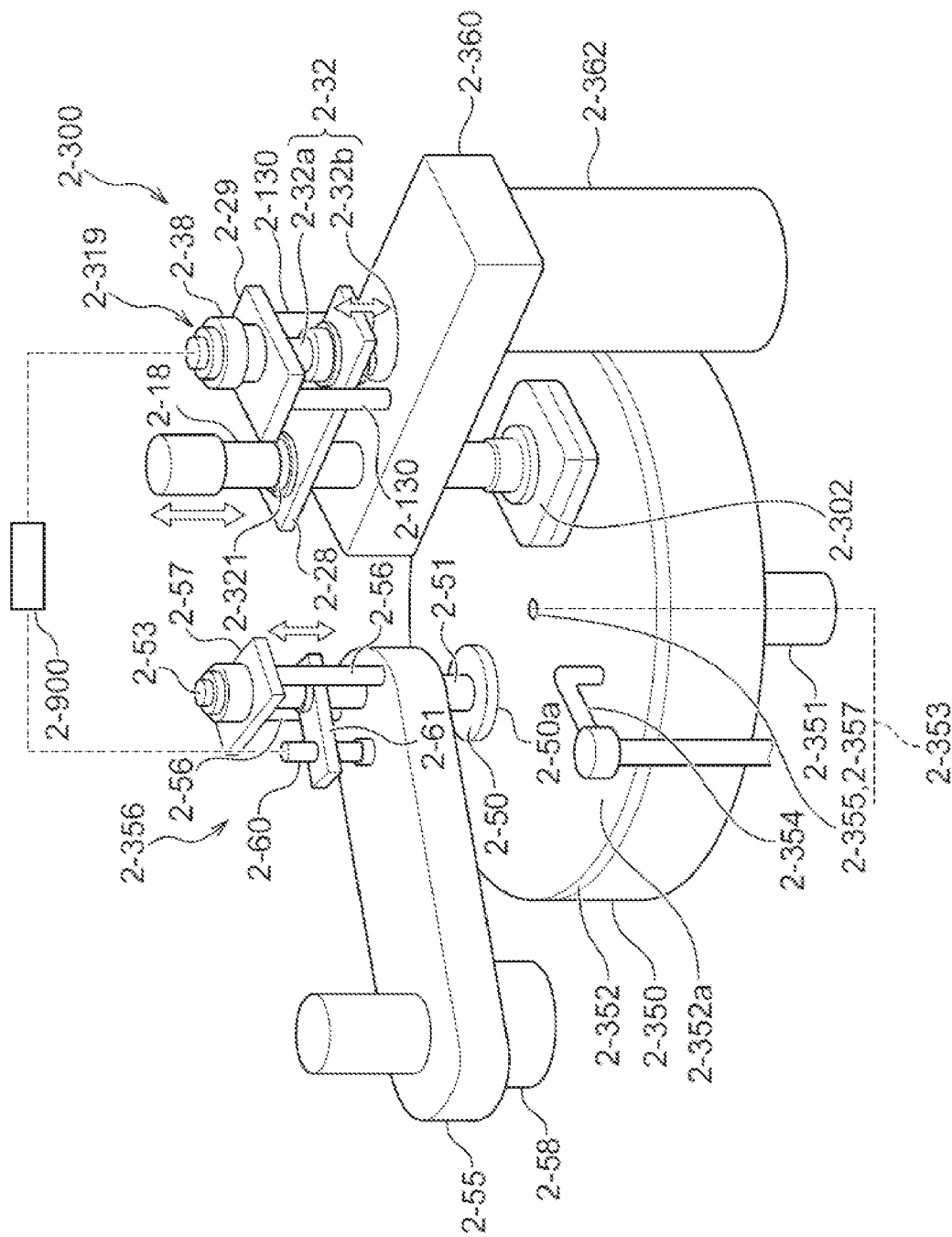
FIG. 14 is a perspective view schematically illustrating a configuration of a polishing unit according to the one embodiment.

FIG. 14 is a perspective view schematically illustrating a configuration of the polishing unit 2-300 according to the one embodiment. The substrate processing apparatus 2-1000 illustrated in FIG. 13 includes two polishing units 2-300A and 2-300B. Since the two polishing units 2-300A and 2-300B can have the same configuration, they will be described collectively as the polishing unit 2-300 below.

As illustrated in FIG. 14, the polishing unit 2-300 includes a polishing table 2-350 and a top ring 2-302 constituting a polishing head that holds and presses the substrate to be polished against a polishing surface on the polishing table 2-350. The polishing table 2-350 is coupled to a polishing table rotation motor (not illustrated), arranged below a table shaft 2-351, via the table shaft 2-351 and is rotatable around the table shaft 2-351. A polishing pad 2-352 is attached to an upper surface of the polishing table 2-350, and a surface 2-352a of the polishing pad 2-352 constitutes a polishing surface that polishes the substrate. In the one embodiment, the polishing pad 2-352 may be attached via a layer for facilitating peeling from the polishing table 2-350. Such a layer includes, for example, a silicone layer or a fluorine-based resin layer, and for example, those described in Japanese Unexamined Patent Application Publication No. 2014-176950 may be used.

A polishing liquid supply nozzle 2-354 is installed above an upper side of the polishing table 2-350, and the polishing liquid is supplied onto the polishing pad 2-352 on the polishing table 2-350 by the polishing liquid supply nozzle 2-354. Further, as illustrated in FIG. 14, the polishing table 2-350 and the table shaft 2-351 are provided with a passage 2-353 for supplying the polishing liquid. The passage 2-353 communicates with an opening portion 2-355 on the surface of the polishing table 2-350. A through hole 2-357 is formed in the polishing pad 2-352 at the position corresponding to the opening portion 2-355 of the polishing table 2-350, and the polishing liquid passing through the passage 2-353 is supplied from the opening portion 2-355 of the polishing table 2-350 and the through hole 2-357 of the polishing pad 2-352 to the surface of the polishing pad 2-352. Note that the numbers of the opening portion 2-355 of the polishing table 2-350 and the through hole 2-357 of the polishing pad 2-352 may be one or plural. Further, although the position of the opening portion 2-355 of the polishing table 2-350 and the through hole 2-357 of the polishing pad 2-352 is arbitrary, in the one embodiment, they are arranged near the center of the polishing table 2-350.

Although not illustrated in FIG. 14, in the one embodiment, the polishing unit 2-300 includes an atomizer 2-358 for injecting a liquid or a mixed fluid of a liquid and a gas toward the polishing pad 2-352 (see FIG. 13). The liquid injected from the atomizer 2-358 is, for example, pure water, and the gas is, for example, nitrogen gas.

The top ring 2-302 is connected to a top ring shaft 2-18, and the top ring shaft 2-18 moves vertically with respect to a swing arm 2-360 by an up-and-down motion mechanism 2-319. The vertical motion of the top ring shaft 2-18 causes the entire top ring 2-302 to move vertically with respect to the swing arm 2-360 for positioning. The top ring shaft 2-18 rotates by driving a top ring rotation motor (not illustrated). The rotation of the top ring shaft 2-18 causes the top ring 2-302 to rotate about the top ring shaft 2-18.

The top ring 2-302 can hold a quadrangular substrate on its lower surface. The swing arm 2-360 is configured to be turnable around a spindle 2-362. The top ring 2-302 can move between the substrate delivery position of the above-described conveyance unit 2-200 and the upper side of the polishing table 2-350 by the turn of the swing arm 2-360. By moving the top ring shaft 2-18 down, the top ring 2-302 can be moved down to press the substrate against the surface (polishing surface) 2-352a of the polishing pad 2-352. At this time, the top ring 2-302 and the polishing table 2-350 are each rotated, and the polishing liquid is supplied from the polishing liquid supply nozzle 2-354 disposed above the polishing table 2-350 and/or from the opening portion 2-355 disposed in the polishing table 2-350 onto the polishing pad 2-352. Thus, by pressing the substrate WF against the polishing surface 2-352a of the polishing pad 2-352, the surface of the substrate WF can be polished. During polishing of the substrate WF, the arm 2-360 may be fixed or swung such that the top ring 2-302 passes through the center of the polishing pad 2-352 (so as to cover the through hole 2-357 of the polishing pad 2-352).

The up-and-down motion mechanism 2-319, which vertically moves the top ring shaft 2-18 and the top ring 2-302, includes a bridge 2-28 that rotatably supports the top ring shaft 2-18 via a bearing 2-321, a ball screw 2-32 mounted to the bridge 2-28, a support table 2-29 supported by a support column 2-130, and an AC servo motor 2-38 disposed on the support table 2-29. The support table 2-29 that supports the servo motor 2-38 is secured to the swing arm 2-360 via the support column 2-130.

The ball screw 2-32 includes a screw shaft 2-32a coupled to the servo motor 2-38 and a nut 2-32b into which the screw shaft 2-32a is screwed. The top ring shaft 2-18 vertically moves integrally with the bridge 2-28. Therefore, when the servo motor 2-38 is driven, the bridge 2-28 vertically moves via the ball screw 2-32, whereby the top ring shaft 2-18 and the top ring 2-302 vertically move.

The polishing unit 2-300 according to the one embodiment includes a dressing unit 2-356 that dresses the polishing surface 2-352a of the polishing pad 2-352. The dressing unit 2-356 includes a dresser 2-50 that is slidably in contact with the polishing surface 2-352a, a dresser shaft 2-51 to which the dresser 2-50 is coupled, an air cylinder 2-53 disposed at an upper end of the dresser shaft 2-51, and a swing arm 2-55 that rotatably supports the dresser shaft 2-51. A lower portion of the dresser 2-50 is constituted by a dressing member 2-50a, and needle-shaped diamond particles are attached to a lower surface of the dressing member 2-50a. The air cylinder 2-53 is arranged on a support table 2-57 supported by support columns 2-56, and these support columns 2-56 are secured to the swing arm 2-55.

The swing arm 2-55 is configured to be driven by a motor (not illustrated) and turn around a spindle 2-58. The dresser shaft 2-51 rotates by driving of a motor (not illustrated), and the rotation of the dresser shaft 2-51 causes the dresser 2-50 to rotate around the dresser shaft 2-51. The air cylinder 2-53 vertically moves the dresser 2-50 via the dresser shaft 2-51 and presses the dresser 2-50 against the polishing surface 2-352*a* of the polishing pad 2-352 with a predetermined pressing force.

Dressing of the polishing surface 2-352*a* of the polishing pad 2-352 is performed in the following manner. The dresser 2-50 is pressed against the polishing surface 2-352*a* by the air cylinder 2-53, and at the same time, pure water is supplied to the polishing surface 2-352*a* from a pure water supply nozzle (not illustrated). In this state, the dresser 2-50 rotates around the dresser shaft 2-51, and the lower surface (diamond particles) of the dressing member 2-50*a* is brought into sliding contact with the polishing surface 2-352*a*. Thus, the dresser 2-50 scrapes off the polishing pad 2-352 and dresses the polishing surface 2-352*a*.

<Drying Unit>

The drying unit 2-500 is a device for drying the substrate WF. In the substrate processing apparatus 2-1000 illustrated in FIG. 13, the drying unit 2-500 dries the substrate WF which is cleaned by the cleaning unit of the conveyance unit 2-200 after being polished by the polishing unit 2-300. As illustrated in FIG. 13, the drying unit 2-500 is arranged downstream of the conveyance unit 2-200. The drying unit 2-500 includes nozzles 2-530 for injecting gas toward the substrate WF being conveyed on the conveyance rollers 2-202. The gas can be, for example, compressed air or nitrogen. The substrate WF can be dried by blowing off water droplets on the conveyed substrate WF with the drying unit 2-500.

<Unloading Unit>

The unloading unit 2-600 is a unit for carrying out the substrate WF after processing, such as polishing and cleaning, is performed to outside of the substrate processing apparatus 2-1000. In the substrate processing apparatus 2-1000 illustrated in FIG. 13, the unloading unit 2-600 receives the substrate after being dried by the drying unit 2-500. As illustrated in FIG. 13, the unloading unit 2-600 is arranged downstream of the drying unit 2-500. In the one embodiment, the unloading unit 2-600 is configured to comply with Mechanical Equipment Interface Standard (IPC-SMEMA-9851) of Surface Mount Equipment Manufacturers Association (SMEMA).

<Top Ring>

Figure 15:
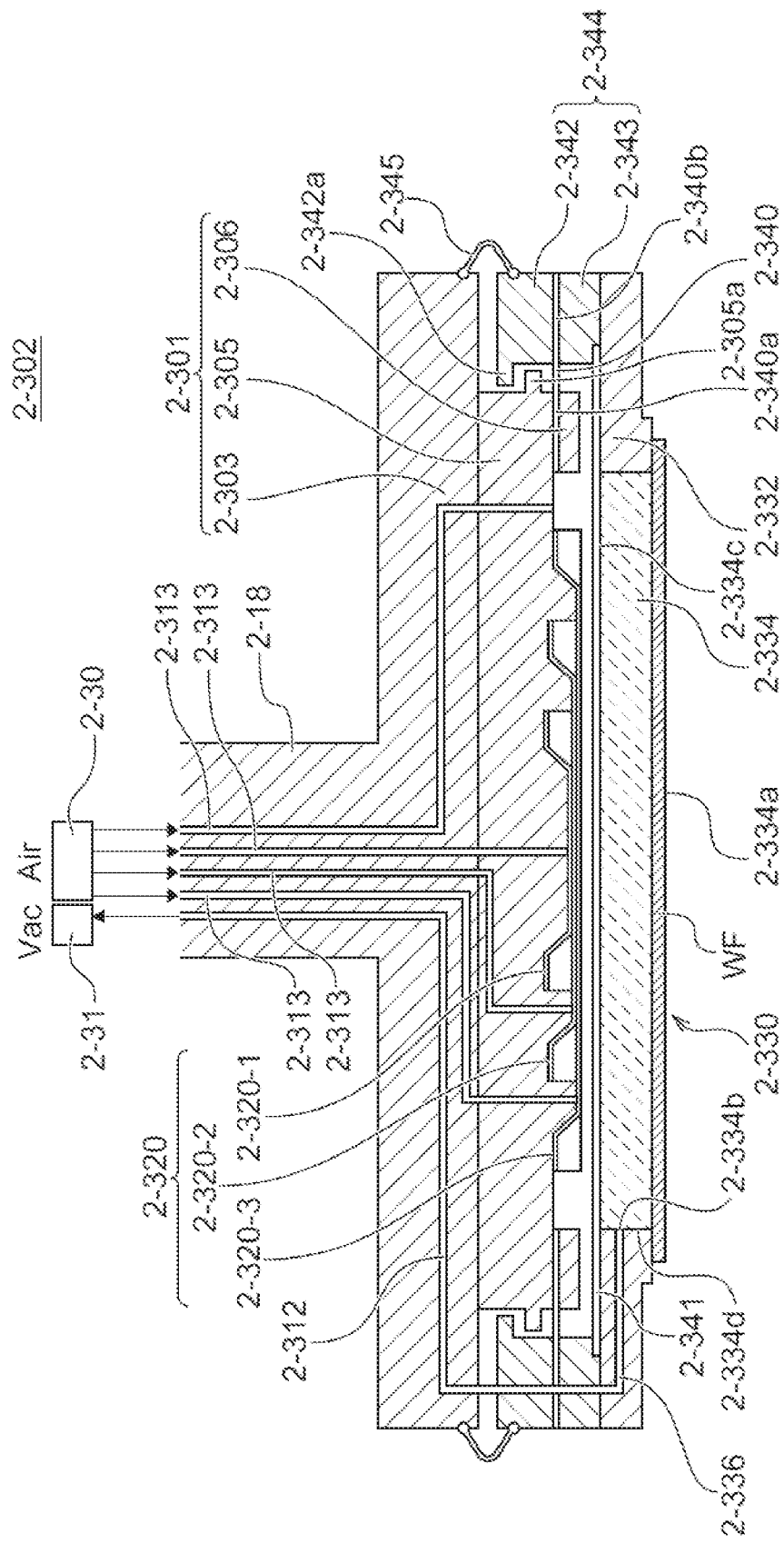
FIG. 15 is a cross-sectional view schematically illustrating a top ring according to the one embodiment.

Next, the top ring 2-302 in the polishing unit 2-300 according to the one embodiment will be described. FIG. 15 is a cross-sectional view schematically illustrating the top ring 2-302 according to the one embodiment. As illustrated in FIG. 15, the top ring 2-302 includes a base member 2-301 coupled to the top ring shaft (rotary shaft) 2-18. Specifically, the base member 2-301 includes a flange 2-303 coupled to the top ring shaft 2-18, an upper portion guiding member 2-305 disposed at a lower portion of the flange 2-303, and a lower portion guiding member 2-306 disposed at a lower portion of the upper portion guiding member 2-305. The upper portion guiding member 2-305 has a smaller plane size than a plane size of the flange 2-303, and projects downward from a lower surface of the flange 2-303. The lower portion guiding member 2-306 is disposed in a frame shape on a peripheral edge portion of a lower surface of the upper portion guiding member 2-305. Note that the plane size of the upper portion guiding member 2-305 or the flange 2-303 is the size of the upper portion guiding member 2-305 or the flange 2-303 when the upper portion guiding member 2-305 or the flange 2-303 is viewed in the plan view (viewed in the direction along the top ring shaft 2-18).

Further, the top ring 2-302 includes a substrate suction member 2-330 for suctioning the back surface of the substrate WF in a state where the surface to be polished faces downward. The substrate suction member 2-330 is arranged below the base member 2-301. The substrate suction member 2-330 includes a porous member 2-334. It is only necessary that the porous member 2-334 is a member that can perform vacuum-suction of the substrate WF by vacuum drawing using a pressure reducing unit (vacuum source) 2-31, and can be constituted of, for example, a resin porous material in which many pores are formed in a resin, such as polyethylene (PE), polypropylene (PP), polytetrafluoroethylene (PTFE), or polyvinyl chloride (PVC). The porous member 2-334 is formed in a plate shape in this embodiment and includes a substrate suction surface 2-334*a* for suctioning the substrate WF and a pressure reducing portion 2-334*b* communicating with the pressure reducing unit (vacuum source) 2-31.

Further, the substrate suction member 2-330 includes a shielding member 2-332. It is only necessary that the shielding member 2-332 is an airtight member that can shield the flow of gas, and can be formed of, for example, a relatively soft resin plate, such as polyethylene (PE), polypropylene (PP), polytetrafluoroethylene (PTFE), or polyvinyl chloride (PVC). In this embodiment, the shielding member 2-332 is formed so as to shield a surface 2-334*c* of the porous member 2-334 on the opposite side of the substrate suction surface 2-334*a* and a side surface 2-334*d*. The shielding member 2-332 includes a vacuum hole 2-336 formed so as to communicate with the porous member 2-334. The pressure reducing portion 2-334*b* is disposed at a position where the vacuum hole 2-336 is formed. In this embodiment, the vacuum hole 2-336 is formed in the shielding member 2-332 so as to communicate with the side surface 2-334*d* of the porous member 2-334, and the pressure reducing portion 2-334*b* is disposed on the side surface 2-334*d*. One end portion of the vacuum hole 2-336 is connected to the side surface 2-334*d* of the porous member 2-334, and the other end portion is connected to the pressure reducing unit 2-31 via a vacuum passage 2-312.

By providing the shielding member 2-332, when the porous member 2-334 is vacuum drawn by the pressure reducing unit (vacuum source) 2-31, negative pressure can be efficiently formed on the substrate suction surface 2-334*a*. Since this allows the substrate WF to be reliably suctioned to the substrate suction member 2-330, jumping out (slipping out) of the substrate WF to outside during polishing can be avoided without providing a retainer member in the periphery of the substrate WF. In particular, as the substrate WF has been thinned in recent years, there is a possibility that the substrate WF slips out during polishing even when the retainer member is provided. Further, when the shape of the substrate WF is quadrangular, there is a possibility that the corner portions of the substrate WF come into contact with the retainer member during polishing, and the substrate WF or the top ring is damaged. In contrast to this, with this embodiment, since the substrate WF can be pressed against the polishing pad 2-352 while being vacuum suctioned by the substrate suction member 2-330, the slipping out of the substrate WF during polishing can be avoided and the damage of the substrate WF or the top ring 2-302 can be avoided during polishing.

Further, in this embodiment, since the pressure reducing portion 2-334*b* is disposed on the side surface 2-334*d* of the porous member 2-334, polishing profile of the substrate WF can be made uniform. That is, the position where the pressure reducing portion 2-334*b* is disposed is vacuum drawn by the pressure reducing unit 2-31, thereby locally having negative pressure. Here, when the pressure reducing portion 2-334*b* is disposed on the surface 2-334*c* of the porous member 2-334 on the opposite side of the substrate suction surface 2-334a, the position locally has negative pressure, and thus, the pressing force on the substrate WF becomes difficult to act as compared with other positions. As a result, there is a possibility that the polishing profile possibly becomes non-uniform. In contrast to this, in this embodiment, since the pressure reducing portion 2-334b is disposed on the side surface 2-334d of the porous member 2-334, local negative pressure is unlikely to occur on the surface 2-334c of the porous member 2-334 on the opposite side of the substrate suction surface 2-334a, and thus, the polishing profile of the substrate WF can be made uniform.

As illustrated in FIG. 15, the substrate suction member 2-330 includes a framing member 2-344 disposed on the shielding member 2-332 so as to surround at least a part of the periphery of the base member 2-301 (specifically, the upper portion guiding member 2-305 and the lower portion guiding member 2-306). The framing member 2-344 includes a lower portion framing member 2-343 disposed in a frame shape on the peripheral edge portion of an upper surface of the shielding member 2-332, and a frame-shaped upper portion framing member 2-342 disposed on the lower portion framing member 2-343. The lower portion framing member 2-343 is coupled to the shielding member 2-332 via a sealing material 2-341. Note that in this embodiment, although the sealing material 2-341 is formed in a film shape covering an upper surface of the substrate suction member 2-330, it is not limited to this. The sealing material 2-341 may be a frame shape having only the peripheral edge portion for sealing the lower portion framing member 2-343 and the shielding member 2-332.

The upper portion framing member 2-342 includes a framing member protrusion 2-342a projecting in a direction toward the base member 2-301 (specifically, the upper portion guiding member 2-305). Further, the upper portion guiding member 2-305 includes a guiding member protrusion 2-305a projecting in a direction toward the upper portion framing member 2-342 at a height position different from that of the framing member protrusion 2-342a. The framing member protrusion 2-342a and the guiding member protrusion 2-305a mutually overlap in a predetermined area when the top ring 2-302 is viewed in the plan view. Therefore, the movement in the height direction of the substrate suction member 2-330 can be restricted by the contact between the framing member protrusion 2-342a and the guiding member protrusion 2-305a.

The substrate suction member 2-330 includes an elastic member 2-340 that connects at least a part of the base member 2-301 surrounded by the framing member 2-344 to the framing member 2-344. Specifically, the elastic member 2-340 is a frame-shaped plate member that includes an inner end portion 2-340a sandwiched between the upper portion guiding member 2-305 and the lower portion guiding member 2-306 and an outer end portion 2-340b sandwiched between the lower portion framing member 2-343 and the upper portion framing member 2-342. The elastic member 2-340 can be formed of a rubber material, for example but not limited to silicon rubber, ethylene propylene diene rubber (EPDM), or fluororubber (FKM).

As illustrated in FIG. 15, the top ring 2-302 includes an elastic film 2-320 configured to form a plurality of pressurization chambers for pressurizing the substrate WF between the base member 2-301 and the substrate suction member 2-330. Specifically, the elastic film 2-320 includes a plurality of pieces of elastic films 2-320-1, 2-320-2, and 2-320-3 that have different areas and are laminated. The elastic films 2-320-1, 2-320-2, and 2-320-3 each include a center portion that is in contact with the upper surface of the shielding member 2-332, and an end portion that extends from the center portion and is secured to a different position of the lower surface of the upper portion guiding member 2-305. With the plurality of elastic films 2-320-1, 2-320-2, and 2-320-3, a plurality of concentric pressurization chambers for pressurizing the substrate WF are formed between the base member 2-301 and the plurality of pieces of elastic films 2-320-1, 2-320-2, and 2-320-3. The plurality of pressurization chambers each communicate with a pressure adjustment portion 2-30 via a pressurization passage 2-313. The pressure adjustment portion 2-30 has a pressure adjustment function for adjusting the pressure of pressurized fluid supplied to each pressurization chamber. By forming the plurality of pressurization chambers, the pressing force of the substrate WF against the polishing pad 2-352 can be controlled for each area via the substrate suction member 2-330. With this embodiment, while the substrate WF is suctioned to the substrate suction surface 2-334a by making the porous member 2-334 to have negative pressure by using the pressure reducing unit 2-31, the substrate WF can be pressed against the polishing pad 2-352 via the substrate suction member 2-330 by pressurizing the pressurization chambers by the pressure adjustment portion 2-30.

Further, as illustrated in FIG. 15, the top ring 2-302 further includes a band 2-345 connecting an outer side surface of the portion of the base member 2-301 that is not surrounded by the framing member 2-344 (specifically, the flange 2-303) to an outer side surface of the framing member 2-344. The band 2-345 is mounted from the outer side surface of the flange 2-303 to the outer side surface of the upper portion framing member 2-342. The band 2-345 allows displacement of the substrate suction member 2-330 relative to the base member 2-301 while avoiding polishing liquid or the like from penetrating into a space between the substrate suction member 2-330 and the base member 2-301.

According to this embodiment, even when the top ring 2-302 or the polishing table 2-350, to which the polishing pad 2-352 is attached, is tilted due to manufacturing tolerances or the like of respective components constituting the substrate processing apparatus 2-1000, the substrate WF can be uniformly pressed against the polishing pad 2-352. That is, according to this embodiment, the substrate suction member 2-330 is not secured to the base member 2-301 but is held to the elastic member 2-340. In view of this, even if the top ring 2-302 or the polishing table 2-350 is tilted and the substrate WF partially contacts the polishing pad 2-352, the elasticity of the elastic member 2-340 causes the substrate suction member 2-330 to align with the polishing surface of the polishing pad 2-352, and as a result, the substrate WF can be brought into contact with the polishing pad 2-352 in parallel. Therefore, with this embodiment, the substrate WF can be uniformly pressed against the polishing pad 2-352.

In addition to this, with this embodiment, a compact top ring can be realized. That is, when the substrate suction member is supported to the base member via the elastic member, it is conceivable to, for example, provide an opening in the center of the lower surface of the base member, install the substrate suction member at the opening, and connect the frame-shaped member on the peripheral edge portion forming the opening to the substrate suction member with the elastic member. However, with such a configuration, when an attempt is made to route the vacuum passage for vacuum suction from the porous member through the frame-shaped member of the top ring, the plane size of the top ring becomes large due to space limitation of the frame-shaped member, which possibly hinders downsizing of the top ring.

In contrast to this, in the top ring 2-302 of this embodiment, the substrate suction member 2-330 includes the framing member 2-344 that surrounds at least a part of the base member 2-301, and connects the framing member 2-344 to the base member 2-301 with the elastic member 2-340. Therefore, as in this embodiment, even when the pressure reducing portion 2-334b is disposed on the side surface 2-334d of the porous member 2-334 and the vacuum passage 2-312 is routed through the outer peripheral portion of the top ring 2-302, the plane size of the framing member 2-344 does not have to be increased, and as a result, the top ring 2-302 can be manufactured compactly. Note that the plane size of the top ring 2-302 or the framing member 2-344 is the size of the top ring 2-302 or the framing member 2-344 when the top ring 2-302 or the framing member 2-344 is viewed in the plan view (viewed in the direction along the top ring shaft 2-18).

Figure 16:
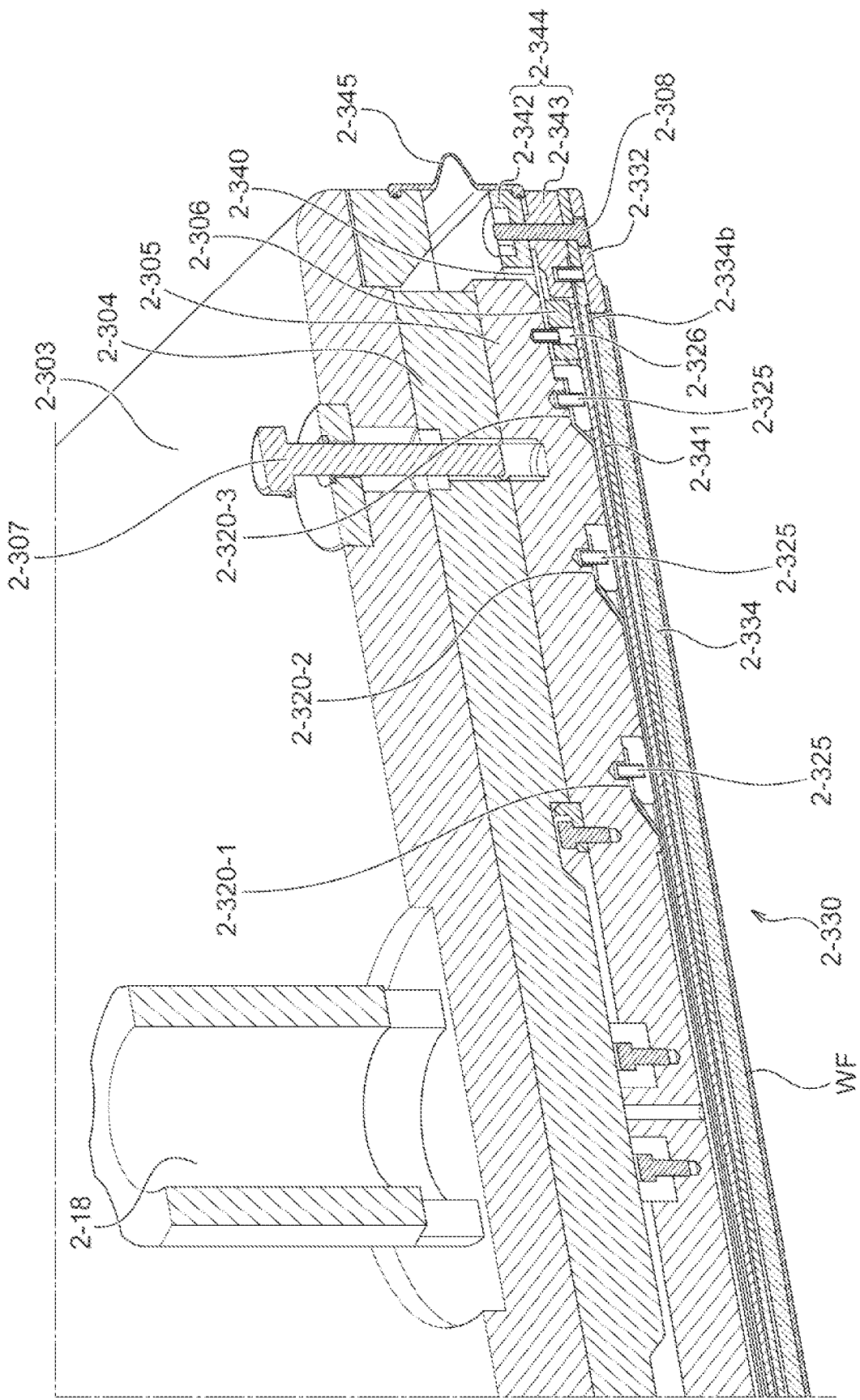
FIG. 16 is a cross-sectional perspective view schematically illustrating a top ring according to the one embodiment.
Figure 17:
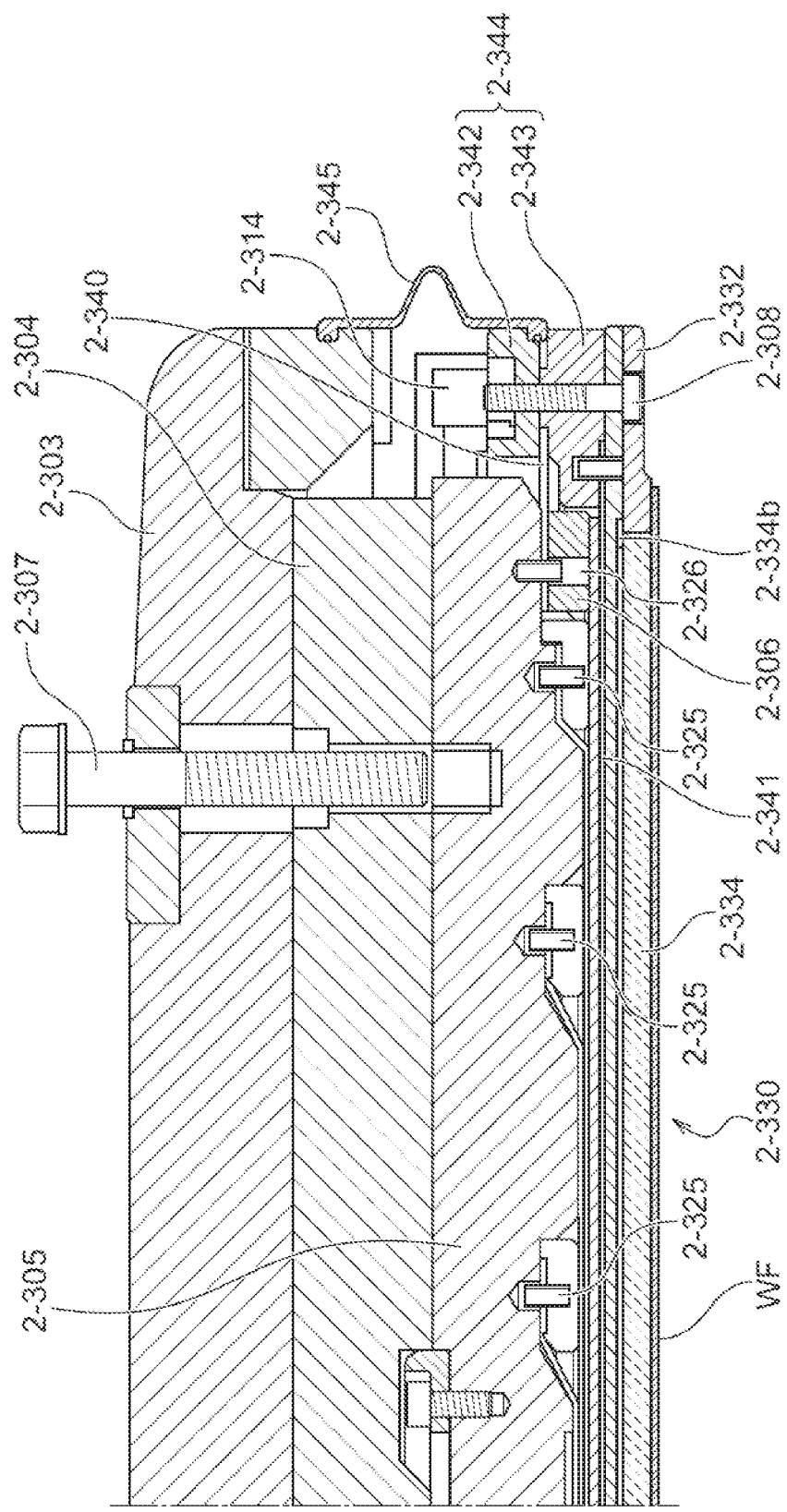
FIG. 17 is a cross-sectional view schematically illustrating a top ring according to the one embodiment.
Figure 18:
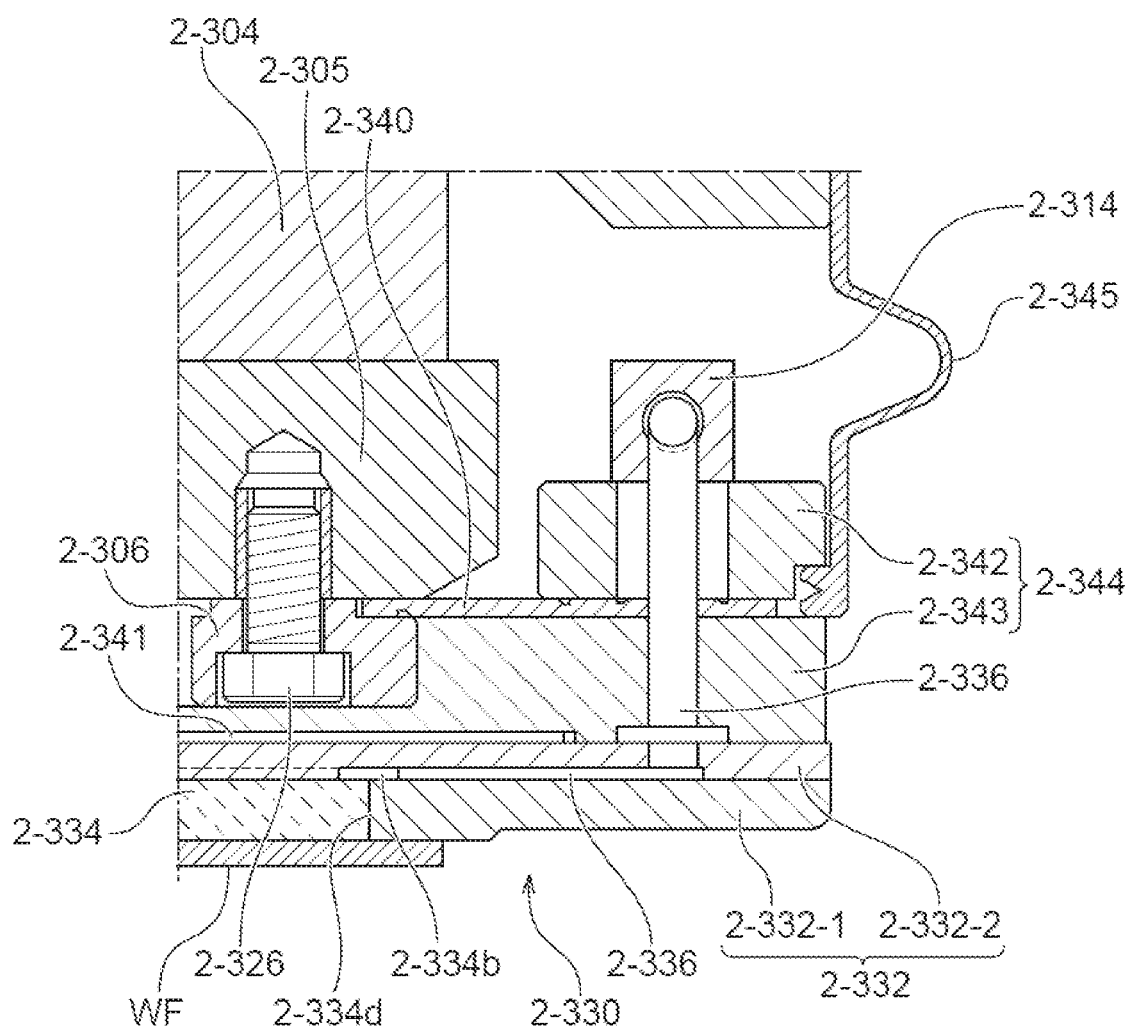
FIG. 18 is an enlarged cross-sectional view schematically illustrating a part of a top ring according to the one embodiment.

Next, another aspect of the top ring 2-302 of this embodiment will be described. FIG. 16 is a cross-sectional perspective view schematically illustrating a top ring according to the one embodiment. FIG. 17 is a cross-sectional view schematically illustrating a top ring according to the one embodiment. FIG. 18 is an enlarged cross-sectional view schematically illustrating a part of a top ring according to the one embodiment. In the embodiments illustrated in FIG. 16 to FIG. 18, the description of duplicate configuration of the embodiment of FIG. 15 will be omitted.

As illustrated in FIG. 16 and FIG. 17, the base member 2-301 is configured to include the flange 2-303 coupled to the top ring shaft 2-18, a spacer 2-304 mounted to the lower surface of the flange 2-303, the upper portion guiding member 2-305 mounted to a lower surface of the spacer 2-304, and the frame-shaped lower portion guiding member 2-306 mounted to the lower surface of the upper portion guiding member 2-305. The flange 2-303, the spacer 2-304, and the upper portion guiding member 2-305 are fastened by bolts 2-307. The upper portion guiding member 2-305 and the lower portion guiding member 2-306 sandwich the elastic member 2-340 and are fastened by bolts 2-326 (in the view, the form of fastening is schematically simplified). The shielding member 2-332, the upper portion framing member 2-342, and the lower portion framing member 2-343 are fastened by bolts 2-308. The respective end portions of the elastic films 2-320-1, 2-320-2, and 2-320-3 are fastened by bolts 2-325 to different positions on the lower surface of the upper portion guiding member 2-305 via respective holders (in the view, the form of fastening is schematically simplified).

As illustrated in FIG. 18, the shielding member 2-332 includes a frame-shaped lower portion shielding member 2-332-1 that surrounds the periphery of the side surface 2-334d of the porous member 2-334 and an upper portion shielding member 2-332-2 that covers the lower portion shielding member 2-332-1 and an upper surface of the porous member 2-334 (the surface 2-334c on the opposite side of the substrate suction surface 2-334a). Further, in this embodiment, the pressure reducing portion 2-334b of the porous member 2-334 is disposed on the peripheral edge portion of the upper surface of the porous member 2-334. The vacuum hole 2-336 includes one end portion that is connected to the pressure reducing portion 2-334b, extends in an outer peripheral direction between the lower portion shielding member 2-332-1 and the upper portion shielding member 2-332-2, and passes through the lower portion framing member 2-343 and the upper portion framing member 2-342 to extend in the upward direction. The vacuum hole 2-336 includes the other end portion that is connected to a vacuum port 2-314 disposed on the upper portion framing member 2-342.

Figure 19A:
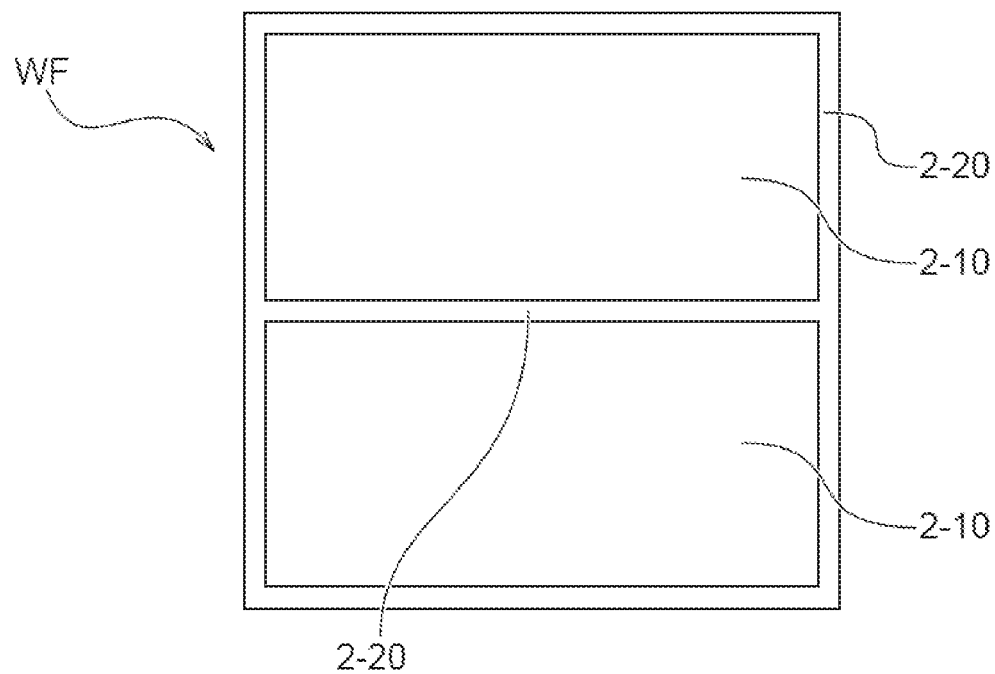
FIG. 19A is a plan view schematically illustrating a pattern area and a non-pattern area of a substrate of the one embodiment.
Figure 19B:
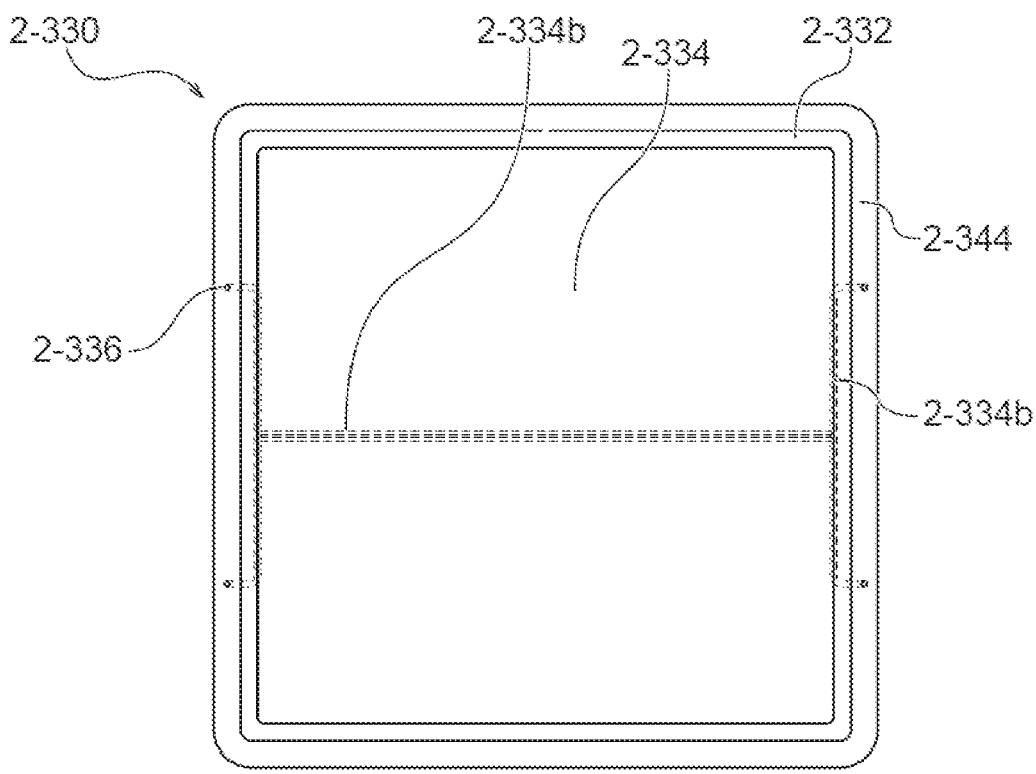
FIG. 19B is a plan view schematically illustrating a substrate suction member of the one embodiment.

FIG. 19A is a plan view schematically illustrating a pattern area and a non-pattern area of a substrate of the one embodiment, and FIG. 19B is a plan view schematically illustrating a substrate suction member of the one embodiment. FIG. 19A schematically illustrates a pattern area and a non-pattern area of a substrate of the one embodiment. As illustrated in FIG. 19A, the substrate WF of this embodiment has a pattern area 2-10 on which wiring, functional chips, or the like are disposed and a non-pattern area 2-20 on which wiring, functional chips, or the like are not disposed. As illustrated in FIG. 19A, the non-pattern area 2-20 is disposed on the peripheral edge portion of the substrate WF and is disposed in a straight line so as to split the area excluding the peripheral edge portion into two upper and lower parts. The pattern area 2-10 is disposed in an area surrounded by the non-pattern area 2-20. As illustrated in FIG. 19B, the pressure reducing portion 2-334b of the porous member 2-334 is disposed corresponding to the non-pattern area 2-20 of the substrate WF. In this embodiment, the pressure reducing portion 2-334b is connected to the vacuum holes 2-336 disposed at four positions. In this embodiment, since the pressure reducing portion 2-334b is disposed corresponding to the non-pattern area 2-20 of the substrate WF, the position where the pressure reducing portion 2-334b is disposed locally becomes to have negative pressure. Even if the pressing force on the substrate WF become difficult to act, the polishing profile on the pattern area 2-10 of the substrate WF is not affected.

Figure 21:
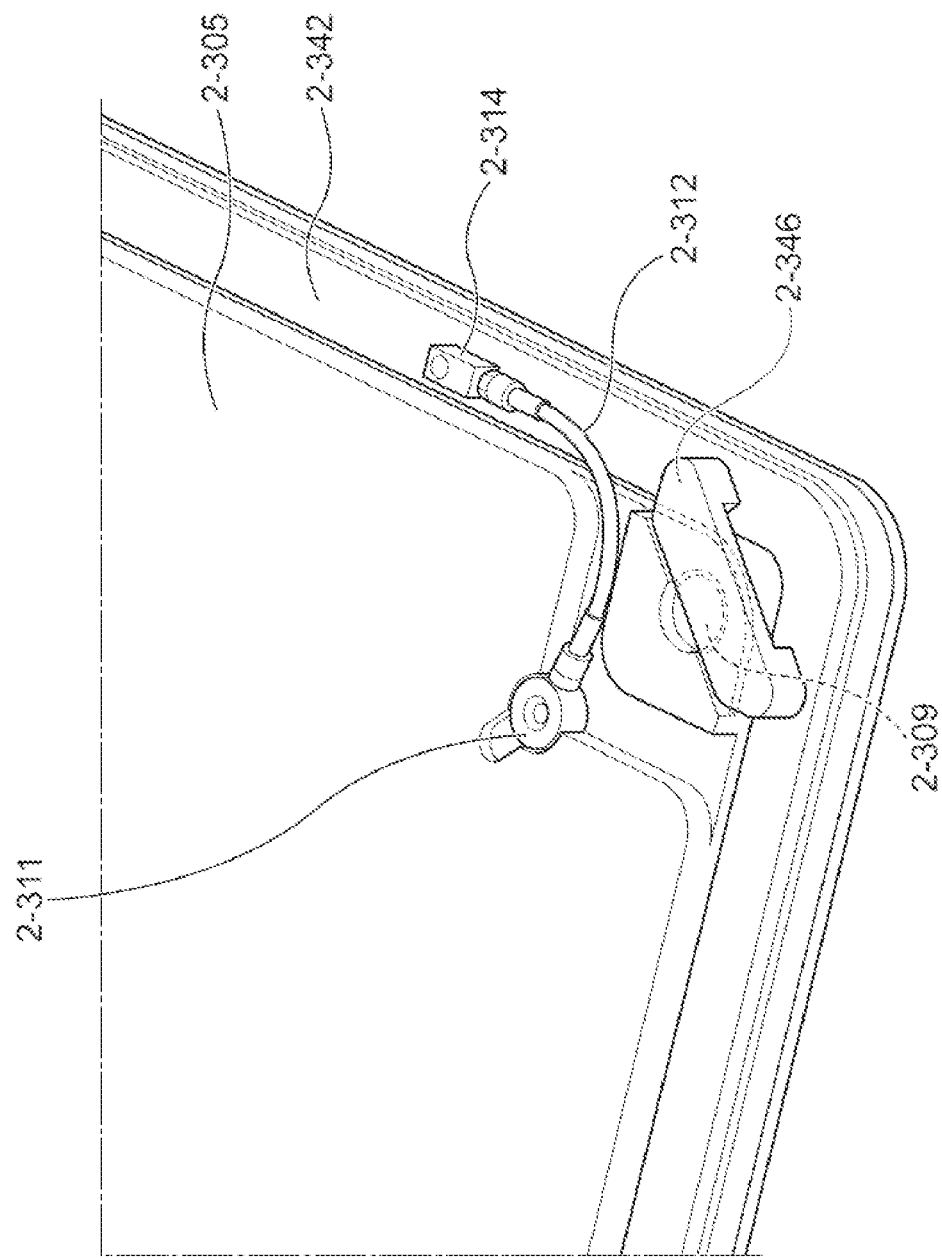
FIG. 21 is an enlarged view of the area AA of FIG. 20.

FIG. 20 is a perspective view schematically illustrating a substrate suction member according to the one embodiment. FIG. 21 is an enlarged view of AA area of FIG. 20. As illustrated in FIG. 20, according to this embodiment, the vacuum ports 2-314 are disposed at four positions corresponding to the vacuum holes 2-336. Each vacuum port 2-314 is connected to the pressure reducing unit 31 (not illustrated) via the vacuum passage 2-312 and a vacuum connector 2-311.

As illustrated in FIG. 20 and FIG. 21, the upper portion framing member 2-342 includes stoppers 2-346 disposed at the respective four corners of the upper portion framing member 2-342. The stopper 2-346 is configured to connect different positions of the upper portion framing member 2-342 over an inside of the frame in an arch shape, and in this embodiment, is configured to connect two sides forming a corner of the upper portion framing member 2-342 in an arch shape. On the other hand, the upper portion guiding member 2-305 includes pads 2-309 disposed at the respective four corners of the upper portion guiding member 2-305. The pad 2-309 is disposed at the position corresponding to the stopper 2-346. The pad 2-309 is formed in a disk shape at a corner of the upper portion framing member 2-342 at a height position different from that of the stopper 2-346. The stopper 2-346 and the pad 2-309 mutually overlap in a predetermined area when the top ring 2-302 is viewed in the plan view. Therefore, the movement of the substrate suction member 2-330 in the height direction can be restricted by the contact between the stopper 2-346 and the pad 2-309.

According to the embodiments illustrated in FIG. 16 to FIG. 21, similarly to the embodiment illustrated in FIG. 15, the substrate suction member 2-330 is not secured to the base member 2-301 but is held to the elastic member 2-340. In view of this, even if the top ring 2-302 or the polishing table 2-350 is tilted and the substrate WF partially contacts the polishing pad 2-352, the elasticity of the elastic member 2-340 causes the substrate suction member 2-330 to align with the polishing surface of the polishing pad 2-352, and as a result, the substrate WF can be uniformly pressed against the polishing pad 2-352. In addition to this, according to the embodiments illustrated in FIG. 16 to FIG. 21, similarly to the embodiment illustrated in FIG. 15, the substrate suction member 2-330 includes the framing member 2-344 surrounding at least a part of the base member 2-301, and connects the framing member 2-344 to the base member 2-301 with the elastic member 2-340. Therefore, even when the vacuum passage 2-312 is routed through the outer peripheral portion of the top ring 2-302, the plane size of the framing member 2-344 does not have to be increased, and as a result, the top ring 2-302 can be manufactured compactly.

In the above description, some embodiments of this invention are explained; and the above embodiments of this invention are those used for facilitating understanding of this invention and are not those for limiting this invention. It is obvious that this invention can be changed or modified without departing from the scope of the gist thereof, and that the scope of this invention includes equivalents thereof. Further, it is possible to arbitrarily combine components or omit a component (components) disclosed in the claims and the specification, within the scope that at least part of the above-stated problems can be solved and/or within the scope that at least part of advantageous effect can be obtained.

This application discloses, as one embodiment, a top ring for holding a substrate that includes a base member, an elastic film, and a substrate suction member. The base member is coupled to a rotary shaft. The elastic film is mounted to the base member and forms a pressurization chamber for pressurizing the substrate between the base member and the elastic film. The substrate suction member includes a porous member having a substrate suction surface for suctioning the substrate and a pressure reducing portion communicating with a pressure reducing unit. The substrate suction member is held to the elastic film.

With this top ring, since the substrate suction member is held to the elastic film, even if the substrate partially contacts a polishing pad, the elasticity of the elastic film allows the substrate to come into contact with the polishing pad in parallel, and as a result, an effect that the substrate can be uniformly pressed against the polishing pad is provided as one example.

Additionally, this application discloses, as the one embodiment, a top ring for holding a substrate that includes a base member, an elastic film, and a substrate holding member. The base member is coupled to a rotary shaft. The elastic film is mounted to the base member and forms a pressurization chamber for pressurizing the substrate between the base member and the elastic film. The substrate holding member includes an elastic plate-shaped member mirror-finished such that an arithmetic mean roughness Ra of the substrate holding surface for holding the substrate becomes less than or equal to 5 µm. The substrate holding member is held to the elastic film.

With this top ring, by mirror-finishing the substrate holding surface of the substrate holding member, a friction force between the substrate and the substrate holding surface improves to allow the substrate to be adhered and held on the substrate holding surface. As a result, with this embodiment, an effect that slipping out of the substrate can be avoided during polishing without using a retainer member to guard a periphery of the substrate is provided as one example.

Additionally, this application discloses, as the one embodiment, the top ring in which the substrate suction member includes the porous member and a shielding member configured to shield a surface of the porous member on an opposite side of the substrate suction surface and a side surface of the porous member.

With this top ring, when the porous member is vacuum drawn by a pressure reducing unit (vacuum source), negative pressure can be efficiently formed on the substrate suction surface, and therefore, the substrate can be suctioned reliably to the substrate suction member and an effect that slipping out of the substrate from the substrate suction member can be avoided during polishing is provided as one example.

Additionally, this application discloses, as the one embodiment, the top ring in which the shielding member includes a hole formed so as to expose the porous member, and the pressure reducing portion is disposed at a position where the hole is formed.

With this top ring, since the porous member can be decompressed via the hole formed in the shielding member, the substrate can be reliably suctioned to the substrate suction member, and an effect that slipping out of the substrate from the substrate suction member can be avoided during polishing is provided as one example.

Additionally, this application discloses, as the one embodiment, the top ring in which the substrate suction member includes a plurality of the porous members and a shielding member configured to shield respective surfaces of the plurality of the porous members on an opposite side of the substrate suction surfaces, the shielding member includes a plurality of holes formed to expose the respective plurality of the porous members, and the respective pressure reducing portions are disposed at positions where the plurality of holes are formed.

With this top ring, since the whole substrate suction member can be decompressed by the pressure reducing unit (vacuum source), even if a substrate is large, the substrate can be firmly suctioned to the substrate suction member. As a result, an effect that slipping out of the substrate from the top ring can be avoided during polishing is provided as one example.

Additionally, this application discloses, as the one embodiment, the top ring in which the base member includes a lower portion guiding member disposed so as to surround a periphery of the substrate suction member and an upper portion guiding member disposed on an upper portion of the lower portion guiding member, and the elastic film includes a center portion covering a surface of the substrate suction member on an opposite side of the substrate suction surface and an end portion sandwiched between the upper portion guiding member and the lower portion guiding member.

With this top ring, since the substrate suction member is held to the elastic film, the end portion of which is sandwiched between the upper portion guiding member and the lower portion guiding member, even if the substrate partially contacts the polishing pad, the elasticity of the elastic film allows the substrate to come into contact with the polishing pad in parallel, and as a result, an effect that the substrate can be uniformly pressed against the polishing pad is provided as one example.

Additionally, this application discloses, as the one embodiment, the top ring in which the elastic film includes a plurality of pieces of elastic films, the plurality of pieces of elastic films include center portions connected to a surface of the substrate suction member on an opposite side of the substrate suction surface and end portions secured to different positions on the base member, the plurality of pieces of elastic films are configured to form a plurality of pressurization chambers for pressurizing the substrate between the base member and the plurality of pieces of elastic films.

With this top ring, an effect that the pressing force of the substrate against the polishing pad can be controlled for each area by forming the plurality of pressurization chambers is provided as one example.

Additionally, this application discloses, as the one embodiment, the top ring that further includes a plurality of stopper members. The plurality of stopper members are coupled to the substrate suction member with the elastic film sandwiched at an end portion of the substrate suction member and have flange portions that project outward with respect to the substrate suction member. The base member includes a lower portion guiding member disposed so as to surround a periphery of the substrate suction member and an upper portion guiding member disposed on an upper portion of the lower portion guiding member, and the upper portion guiding member and the lower portion guiding member have regulating surfaces that regulate movement of the flange portions of the stopper members in a vertical direction.

With this top ring, an effect that a range of the movement in the vertical direction of the substrate suction member can be restricted to a desired range is provided as one example.

Additionally, this application discloses, as the one embodiment, a substrate processing apparatus that includes any of the above-described top ring and a polishing table configured to hold a polishing pad.

In this substrate processing apparatus, since the substrate suction member is held to the elastic film, even if the substrate partially contacts the polishing pad, the elasticity of the elastic film allows the substrate to come into contact with the polishing pad in parallel, and as a result, an effect that the substrate can be uniformly pressed against the polishing pad is provided as one example.

This application discloses, as the one embodiment, the top ring for holding a substrate that includes a base member, a substrate suction member, and an elastic member. The base member is coupled to a rotary shaft. The substrate suction member includes a porous member, a shielding member, and a framing member. The porous member includes a substrate suction surface for suctioning the substrate and a pressure reducing portion communicating with a pressure reducing unit. The shielding member is configured to shield a surface of the porous member on an opposite side of the substrate suction surface and a side surface. The framing member is disposed on the shielding member so as to surround at least a part of a periphery of the base member. The elastic member connects the at least a part of the base member surrounded by the framing member to the framing member.

Additionally, this application discloses, as the one embodiment, the top ring in which the shielding member includes a vacuum hole formed so as to communicate with the porous member, and the pressure reducing portion is disposed at a position where the vacuum hole is formed.

Additionally, this application discloses, as the one embodiment, the top ring in which the vacuum hole is formed in the shielding member so as to communicate with a peripheral edge portion of an upper surface of the porous member or the side surface of the porous member.

Additionally, this application discloses, as the one embodiment, the top ring in which the framing member includes a lower portion framing member disposed on a peripheral edge portion of an upper surface of the shielding member and an upper portion framing member disposed above the lower portion framing member, the base member includes a flange coupled to the rotary shaft, an upper portion guiding member disposed on a lower portion of the flange and having a smaller plane size than a plane size of the flange, and a frame-shaped lower portion guiding member disposed on a lower portion of the upper portion guiding member, and the elastic member is a plate-shaped member that includes an inner end portion sandwiched between the upper portion guiding member and the lower portion guiding member and an outer end portion sandwiched between the lower portion framing member and the upper portion framing member.

Additionally, this application discloses, as the one embodiment, the top ring in which the upper portion framing member or the lower portion framing member includes a framing member protrusion projecting in a direction toward the base member, and the upper portion guiding member or the lower portion guiding member includes a guiding member protrusion that projects in a direction toward the upper portion framing member or the lower portion framing member at a height position different from a height position of the framing member protrusion and overlaps the framing member protrusion.

Additionally, this application discloses, as the one embodiment, the top ring in which the upper portion framing member or the lower portion framing member includes a stopper connecting different positions of the upper portion framing member or the lower portion framing member over an inside of the frame in an arch shape, and the upper portion guiding member or the lower portion guiding member includes a pad overlapping the stopper at a height position different from a height position of the stopper.

Additionally, this application discloses, as the one embodiment, the top ring that further includes a plurality of pieces of elastic films configured to form a plurality of pressurization chambers for pressurizing the substrate between the base member and the substrate suction member.

Additionally, this application discloses, as the one embodiment, the top ring that further includes a band connecting an outer side surface of a portion of the base member that is not surrounded by the framing member and an outer side surface of the framing member.

Additionally, as the one embodiment, this application discloses a substrate processing apparatus that includes any of the above-described top ring and a polishing table configured to hold a polishing pad.

REFERENCE SIGNS LIST

18 . . . top ring shaft (rotary shaft)
31 . . . pressure reducing unit (vacuum source)
300 . . . polishing unit
301 . . . base member
302 . . . top ring
303 . . . flange
304 . . . spacer
305 . . . upper portion guiding member
305a, 306a . . . regulating surface
306 . . . lower portion guiding member
320.402.420 . . . elastic film
322 . . . pressurization chamber
330 . . . substrate suction member
332 . . . shielding member
334 . . . porous member
334a . . . substrate suction surface
334b . . . pressure reducing portion
352 . . . polishing pad 430 . . . substrate holding member
431 . . . elastic plate-shaped member
431a . . . substrate holding surface
1000 . . . substrate processing apparatus
2-18 . . . top ring shaft (rotary shaft)
2-31 . . . pressure reducing unit (vacuum source)
2-301 . . . base member
2-302 . . . top ring
2-303 . . . flange
2-305 . . . upper portion guiding member
2-305a . . . guiding member protrusion
2-306 . . . lower portion guiding member
2-309 . . . pad
2-312 . . . vacuum passage
2-314 . . . vacuum port
2-320 . . . elastic film
2-330 . . . substrate suction member
2-332 . . . shielding member
2-332-1 . . . lower portion shielding member
2-332-2 . . . upper portion shielding member
2-334 . . . porous member
2-334a . . . substrate suction surface
2-334b . . . pressure reducing portion
2-334c . . . surface on opposite side of substrate suction surface 2-334a
2-334d . . . side surface
2-336 . . . vacuum hole
2-340 . . . elastic member
2-340a . . . inner end portion
2-340b . . . outer end portion
2-342 . . . upper portion framing member
2-342a . . . framing member protrusion
2-343 . . . lower portion framing member
2-344 . . . framing member
2-345 . . . band
2-346 . . . stopper
2-1000 . . . substrate processing apparatus
WF . . . substrate

What is claimed is:

1. A top ring for holding a substrate, comprising:
a base member coupled to a rotary shaft;
an elastic film that is mounted to the base member and forms a pressurization chamber for pressurizing the substrate between the base member and the elastic film;
a substrate suction member that includes a porous member having a substrate suction surface for suctioning the substrate and a pressure reducing portion communicating with a pressure reducing unit, the substrate suction member being held to the elastic film; and
a plurality of stopper members that are coupled to the substrate suction member, each of the stopper members having a flange portion that project outward with respect to the substrate suction member, a part of the elastic film being sandwiched between an end portion of the substrate suction member and each of the stopper members,
wherein the base member includes a lower portion guiding member disposed so as to surround a periphery of the substrate suction member and an upper portion guiding member disposed on an upper portion of the lower portion guiding member, and
the upper portion guiding member and the lower portion guiding member have regulating surfaces that regulate movement of the flange portions of the stopper members in a vertical direction.

2. The top ring according to claim 1, wherein
the substrate suction member includes the porous member and a shielding member configured to shield a surface of the porous member on an opposite side of the substrate suction surface and a side surface of the porous member.

3. The top ring according to claim 2, wherein
the shielding member includes a hole formed so as to expose the porous member, and
the pressure reducing portion is disposed at a position where the hole is formed.

4. The top ring according to claim 1, wherein
the substrate suction member includes a plurality of the porous members and a shielding member configured to shield respective surfaces of the plurality of the porous members on an opposite side of the substrate suction surfaces,
the shielding member includes a plurality of holes formed to expose the respective plurality of the porous members, and
the respective pressure reducing portions are disposed at positions where the plurality of holes are formed.

5. The top ring according to claim 1, wherein
the elastic film includes a center portion covering a surface of the substrate suction member on an opposite side of the substrate suction surface and an end portion sandwiched between the upper portion guiding member and the lower portion guiding member.

6. The top ring according to claim 1, wherein
the elastic film includes a plurality of pieces of elastic films,
the plurality of pieces of elastic films include center portions connected to a surface of the substrate suction member on an opposite side of the substrate suction surface and end portions secured to different positions on the base member, and
the plurality of pieces of elastic films are configured to form a plurality of pressurization chambers for pressurizing the substrate between the base member and the plurality of pieces of elastic films.

7. A top ring for holding a substrate, comprising:
a base member coupled to a rotary shaft;
an elastic film that is mounted to the base member and forms a pressurization chamber for pressurizing the substrate between the base member and the elastic film; and
a substrate holding member that includes an elastic plate-shaped member mirror-finished such that an arithmetic mean roughness Ra of the substrate holding surface for holding the substrate becomes less than or equal to 5 um, and the substrate holding member being held to the elastic film,
wherein the base member includes a lower portion guiding member disposed so as to surround a periphery of the substrate holding member.

8. A substrate processing apparatus comprising:
a top ring for holding a substrate, comprising:
a base member coupled to a rotary shaft;
an elastic film that is mounted to the base member and forms a pressurization chamber for pressurizing the substrate between the base member and the elastic film;
a substrate suction member that includes a porous member having a substrate suction surface for suctioning the substrate and a pressure reducing portion communicating with a pressure reducing unit, the substrate suction member being held to the elastic film; and a plurality of stopper members that are coupled to the substrate suction member, each of the stopper members having a flange portion that project outward with respect to the substrate suction member, a part of the elastic film being sandwiched between an end portion of the substrate suction member and the each of the stopper members, wherein the base member includes a lower portion guiding member disposed so as to surround a periphery of the substrate suction member and an upper portion guiding member disposed on an upper portion of the lower portion guiding member, and the upper portion guiding member and the lower portion guiding member have regulating surfaces that regulate movement of the flange portions of the stopper members in a vertical direction, the substrate processing apparatus further comprising:
a polishing table configured to hold a polishing pad.

9. A top ring for holding a substrate, comprising:
a base member coupled to a rotary shaft;
a substrate suction member that includes a porous member that includes a substrate suction surface for suctioning the substrate and a pressure reducing portion communicating with a pressure reducing unit, a shielding member that is configured to shield a surface of the porous member on an opposite side of the substrate suction surface and a side surface, and a framing member that is disposed on the shielding member so as to surround at least a part of a periphery of the base member; and
an elastic member that connects the at least a part of the base member surrounded by the framing member to the framing member,
the framing member includes a lower portion framing member disposed on a peripheral edge portion of an upper surface of the shielding member and an upper portion framing member disposed above the lower portion framing member,
the base member includes a flange coupled to the rotary shaft, an upper portion guiding member disposed on a lower portion of the flange and having a smaller plane size than a plane size of the flange, and a frame-shaped lower portion guiding member disposed on a lower portion of the upper portion guiding member, and
the elastic member is a plate-shaped member that includes an inner end portion sandwiched between the upper portion guiding member and the lower portion guiding member and an outer end portion sandwiched between the lower portion framing member and the upper portion framing member.

10. The top ring according to claim 9, wherein
the shielding member includes a vacuum hole formed so as to communicate with the porous member, and
the pressure reducing portion is disposed at a position where the vacuum hole is formed.

11. The top ring according to claim 10, wherein
the vacuum hole is formed in the shielding member so as to communicate with a peripheral edge portion of an upper surface of the porous member or the side surface of the porous member.

12. The top ring according to claim 9, wherein
the upper portion framing member or the lower portion framing member includes a framing member protrusion projecting in a direction toward the base member, and
the upper portion guiding member or the lower portion guiding member includes a guiding member protrusion that projects in a direction toward the upper portion framing member or the lower portion framing member at a height position different from a height position of the framing member protrusion and overlaps the framing member protrusion.

13. The top ring according to claim 9, wherein
the upper portion framing member or the lower portion framing member includes a stopper connecting different positions of the upper portion framing member or the lower portion framing member over an inside of the frame in an arch shape, and
the upper portion guiding member or the lower portion guiding member includes a pad overlapping the stopper at a height position different from a height position of the stopper.

14. The top ring according to claim 9, further comprising
a plurality of pieces of elastic films configured to form a plurality of pressurization chambers for pressurizing the substrate between the base member and the substrate suction member.

15. The top ring according to claim 9, further comprising
a band connecting an outer side surface of a portion of the base member that is not surrounded by the framing member and an outer side surface of the framing member.

16. A substrate processing apparatus comprising:
a top ring for holding a substrate, comprising:
a base member coupled to a rotary shaft;
a substrate suction member that includes a porous member that includes a substrate suction surface for suctioning the substrate and a pressure reducing portion communicating with a pressure reducing unit, a shielding member that is configured to shield a surface of the porous member on an opposite side of the substrate suction surface and a side surface, and a framing member that is disposed on the shielding member so as to surround at least a part of a periphery of the base member; and
an elastic member that connects the at least a part of the base member surrounded by the framing member to the framing member,
the framing member includes a lower portion framing member disposed on a peripheral edge portion of an upper surface of the shielding member and an upper portion framing member disposed above the lower portion framing member,
the base member includes a flange coupled to the rotary shaft, an upper portion guiding member disposed on a lower portion of the flange and having a smaller plane size than a plane size of the flange, and a frame-shaped lower portion guiding member disposed on a lower portion of the upper portion guiding member, and
the elastic member is a plate-shaped member that includes an inner end portion sandwiched between the upper portion guiding member and the lower portion guiding member and an outer end portion sandwiched between the lower portion framing member and the upper portion framing member,
the substrate processing apparatus further comprising:
a polishing table configured to hold a polishing pad.

17. The top ring according to claim 1, wherein
the substrate suction member includes the porous member and a sealing member configured to shield a side surface of the porous member.

18. The top ring according to claim 1, wherein
the substrate suction member includes the porous member and a sealing member configured to shield a side surface of the porous member and a peripheral edge portion of a substrate suction surface of the porous member.

\* \* \* \* \*

UNITED STATES PATENT AND TRADEMARK OFFICE
CERTIFICATE OF CORRECTION

Page 1 of 1

PATENT NO. : 11,701,750 B2
APPLICATION NO. : 17/099571
DATED : July 18, 2023
INVENTOR(S) : Yu Ishii et al.

It is certified that error appears in the above-identified patent and that said Letters Patent is hereby corrected as shown below:

On the Title Page

Please insert the following:
--(30) FOREIGN APPLICATION PRIORITY DATA
Nov. 19, 2019 (JP)...................2019-208865
Oct. 01, 2020 (JP).................. 2020-167306--

Signed and Sealed this
Sixteenth Day of July, 2024

Katherine Kelly Vidal
*Director of the United States Patent and Trademark Office*